United States Patent
Chibana et al.

(10) Patent No.: US 7,057,701 B2
(45) Date of Patent: Jun. 6, 2006

(54) EXPOSURE APPARATUS

(75) Inventors: Takahito Chibana, Tochigi (JP); Kiyoshi Arakawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 119 days.

(21) Appl. No.: 10/786,063

(22) Filed: Feb. 26, 2004

(65) Prior Publication Data

US 2005/0030496 A1 Feb. 10, 2005

(30) Foreign Application Priority Data

Feb. 28, 2003 (JP) .............................. 2003-053892

(51) Int. Cl.
  *G03B 27/52* (2006.01)
  *G03B 27/42* (2006.01)
(52) U.S. Cl. ........................... 355/30; 355/53; 359/509
(58) Field of Classification Search .................. 355/30, 355/53, 77; 359/509, 667
  See application file for complete search history.

(56) References Cited

U.S. PATENT DOCUMENTS

| | | | | |
|---|---|---|---|---|
| 4,801,352 A | * | 1/1989 | Piwczyk | 156/345.5 |
| 5,997,963 A | * | 12/1999 | Davison et al. | 427/582 |
| 6,542,220 B1 | * | 4/2003 | Schrijver et al. | 355/53 |
| 6,665,046 B1 | | 12/2003 | Nogawa et al. | 355/30 |
| 6,707,530 B1 | * | 3/2004 | Schrijver et al. | 355/30 |
| 6,731,371 B1 | * | 5/2004 | Shiraishi | 355/30 |
| 2001/0038422 A1 | * | 11/2001 | Yamada et al. | 348/478 |
| 2002/0018190 A1 | | 2/2002 | Nogawa et al. | 355/30 |
| 2002/0057422 A1 | | 5/2002 | Arakawa | 355/30 |
| 2002/0191163 A1 | * | 12/2002 | Hasegawa et al. | 355/30 |
| 2002/0191166 A1 | * | 12/2002 | Hasegawa et al. | 355/53 |
| 2003/0025889 A1 | * | 2/2003 | Hasegawa et al. | 355/30 |

FOREIGN PATENT DOCUMENTS

| | | |
|---|---|---|
| JP | 2001-118783 | 4/2001 |
| JP | 2001-358056 | 12/2001 |

* cited by examiner

*Primary Examiner*—Alan Mathews
(74) *Attorney, Agent, or Firm*—Fitzpatrick, Cella, Harper & Scinto

(57) ABSTRACT

An exposure apparatus for exposing a substrate to light via a mask. The apparatus includes a projection optical system configured to project a pattern of the mask onto the substrate, a cover configured to surround a path of light from the projection optical system toward the substrate, a first supply port arranged inside the cover and configured to supply inert gas inside the cover, a first recovery port arranged inside the cover and configured to recover gas inside the cover, a second supply port arranged outside the cover and configured to supply gas outside the cover, and a second recovery port arranged outside the cover and configured to recover gas outside the cover. The first direction from the first supply port to the first recovery port and a second direction from the second supply port to the second recovery port oppose each other at an angle not greater than 90°.

16 Claims, 26 Drawing Sheets

PRESSURE IS HIGH

SCANNING DIRECTION

SCANNING DIRECTION

IMPURITY CONCENTRATION IS HIGH

SCANNING DIRECTION

SCANNING DIRECTION

IMPURITY CONCENTRATION IS LOW

IMPURITY CONCENTRATION IS HIGH

SCANNING DIRECTION

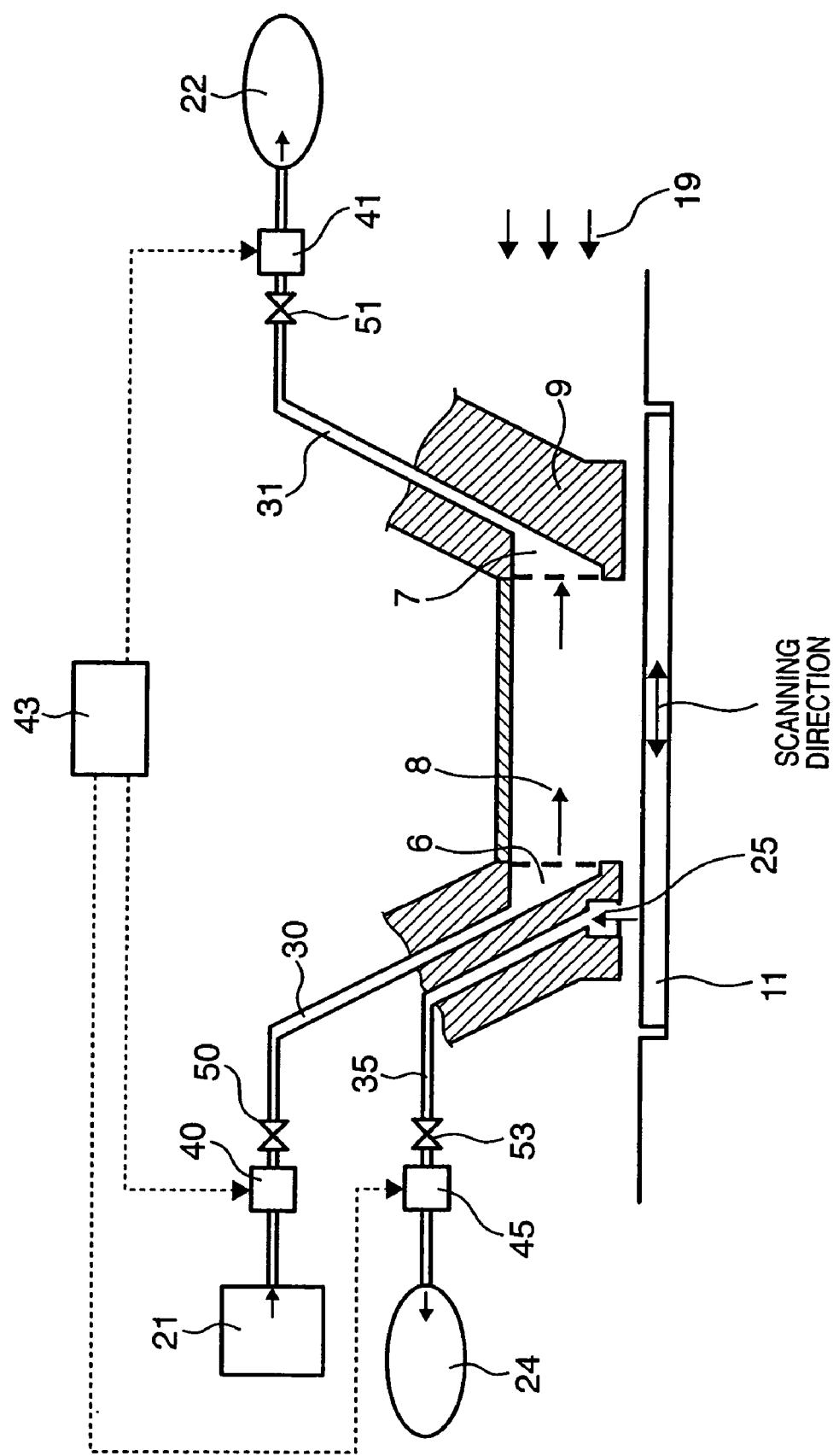

SCANNING DIRECTION

SCANNING DIRECTION

IMPURITY CONCENTRATION IS HIGH

IMPURITY CONCENTRATION IS LOW

SCANNING DIRECTION

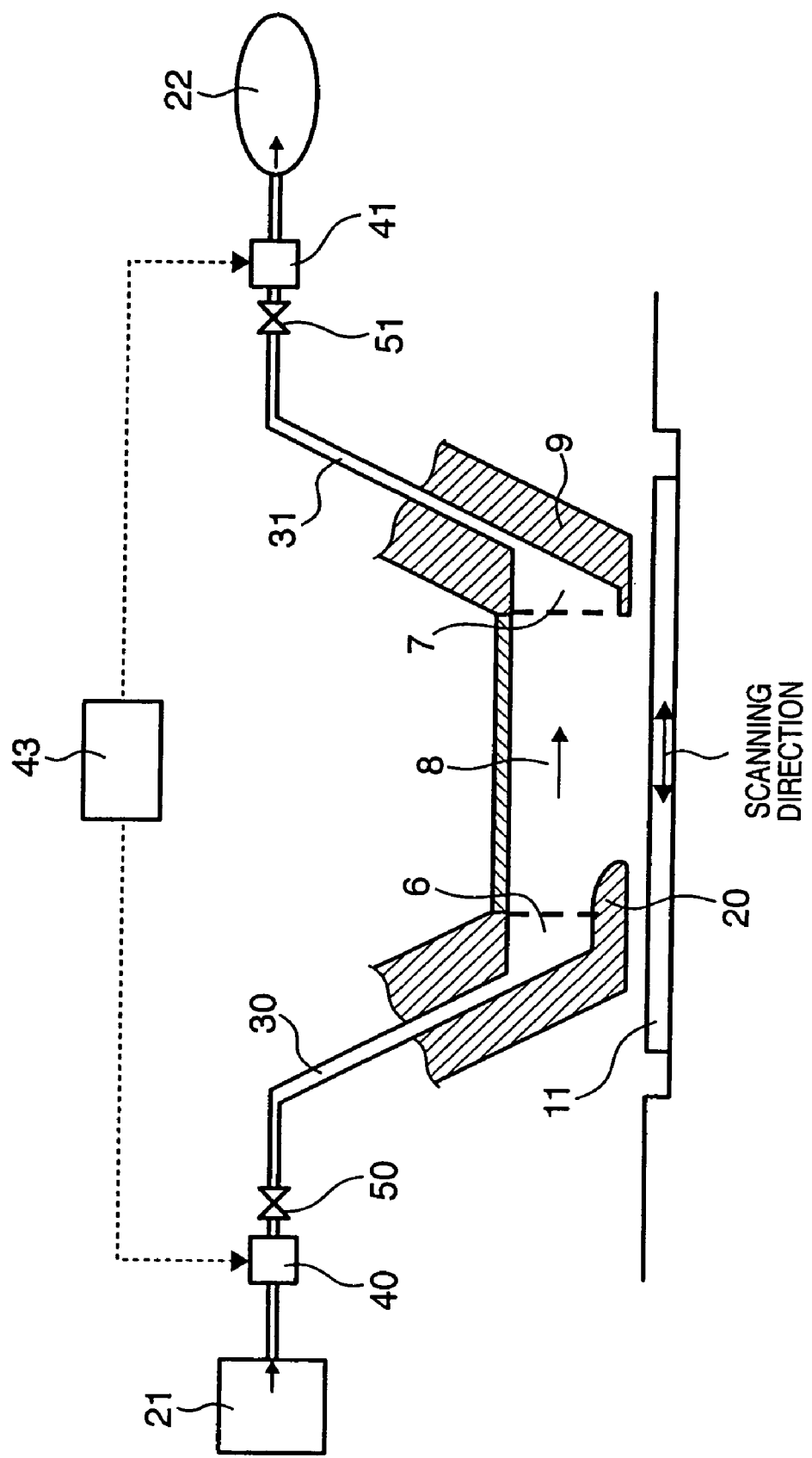

EXPOSURE APPARATUS

FIELD OF THE INVENTION

The present invention relates to an exposure apparatus which forms a pattern on a photosensitive substrate by irradiating the photosensitive substrate with exposure light through a projection optical system and, more particularly, to an exposure apparatus suitably applied to an exposure apparatus that uses ultraviolet light as exposure light.

BACKGROUND OF THE INVENTION

Generally, a manufacturing process for a semiconductor device such as an LSI or VLSI formed from a micropattern uses a reduction type projection exposure apparatus which reduces and projects a circuit pattern drawn on a mask onto a substrate coated with a photosensitive agent and exposes it. With an increase in the packaging density of semiconductor devices, demands have arisen for further micropatterning. Exposure apparatuses are coping with micropatterning along with the development of a resist process.

An ArF excimer laser with an oscillation wavelength around far infrared rays, particularly, 193 nm, and a fluorine ($F_2$) excimer laser with an oscillation wavelength around 157 nm are known to have absorption bands for oxygen ($O_2$) and moisture ($H_2O$). Therefore, in the optical path of the exposure optical system of a projection exposure apparatus using a far ultraviolet laser such as an ArF excimer laser or a fluorine ($F_2$) excimer laser as a light source, the oxygen and moisture concentration (to be referred to as an impurity concentration hereinafter) present in the optical path must be suppressed to a low level of ppm order or less by a purge means using inert gas such as nitrogen.

In such an exposure apparatus using the far ultraviolet laser as the light source, the exposure path is partly purged with inert gas. For example, FIG. 1 is a view for explaining a purge means in the vicinity of a wafer shown in Japanese Patent Laid-Open No. 2001-358056.

In the exposure apparatus portion shown in FIG. 1, a wafer stage 110 supported by an installed surface plate through an anti-vibration unit is mounted on a stage surface plate 118. A frame 117 supports a projection optical system 105. The frame 117, the stage surface plate 118, and partition walls 113 and 114 form an isolated space including the wafer stage 110.

FIG. 1 shows a purge means as follows. A cover 109 extends from the wafer-side lower end of the projection optical system 105 toward the vicinity of the wafer stage 110 to surround an exposure optical path. The cover 109 has a supply port 106 through which purge gas formed of inert gas blows out. A recovery port 107 through which the purge gas is drawn by suction is formed to oppose the supply port 106. Thus, the purge gas is supplied to flow inside the cover 109. In FIG. 1, a gap is formed between the cover 109 and wafer 111 so that the cover 109 and a wafer 111 will not interfere with each other. Various types of products (released gas) generated during exposure from a photosensitive agent applied on the substrate surface may attach to the surface of an optical element to decrease the efficiency of the optical system. In view of this, the purge gas flows in one direction (indicated by 108) inside the cover 109, so that the released gas can be recovered efficiently.

Around the wafer stage, the temperature and humidity must be maintained at predetermined values. Hence, generally, temperature- and humidity-adjusted air, or temperature- and humidity-adjusted inert gas having a higher impurity concentration than that of the purge gas to be supplied to the inside of the cover 109, is supplied to flow around the wafer stage and projection lens.

As described above, in the exposure apparatus utilizing far ultraviolet rays, the cover 109 is formed at the wafer-side end of the projection optical system 105. The purge gas supply port 106 and exhaust port 107 are formed inside the cover 109. The purge gas is supplied to flow in one direction, thus performing purging. According to the present inventor, however, since the gap is formed between the cover 109 and wafer 111, a whirl tends to be generated in the vicinity of the lower side of the supply port 106 (see FIG. 2A). Where the whirl is generated, the pressure is lower than the pressure around the cover 109. Accordingly, ambient air or purge inert gas having a high impurity concentration enters the inside of the cover 109. This degrades the impurity concentration inside the cover 109 to undesirably decrease the transmittance of the exposure light. As a result, the exposure time prolongs, and the productivity of the apparatus is degraded.

A state wherein a whirl is generated in the vicinity of the lower side of the supply port 106 to decrease the pressure will be described with reference to FIGS. 2A and 2B. FIG. 2A is a stream diagram of the purge gas in the central section inside the cover 109, and FIG. 2B is a schematic contour diagram of the pressure distribution taken at the same location as that of FIG. 2A. In the schematic contour diagram of FIG. 2B, the darker the color, the higher the pressure; the lighter the color, the lower the pressure.

When a gap is formed between the cover 109 and wafer 111, a whirl is generated in the vicinity of the lower side of the supply port 106, as shown in FIG. 2A. Where the whirl is generated, the pressure is low, as shown in FIG. 2B. When a pressure P1 in the vicinity of the lower side of the supply port 106 becomes lower than a pressure P2 outside the cover 109, air or purge inert gas with a high impurity concentration enters the cover 109 from around. Hence, to purge the inside of the cover 109 stably, the pressure inside the cover 109, particularly the pressure P1 in the vicinity of the lower side of the supply port 106, must be kept higher than the pressure P2 around the cover 109.

According to the present inventor, the flow (to be referred to as ambient flow hereinafter) of air and purge inert gas around the projection lens and wafer stage outside the cover 109 also largely adversely affects the purging performance inside the cover 109. The gas flow and pressure distribution in the vicinity of the cover 109, when an ambient flow exists, will be described with reference to FIGS. 3A and 3B.

FIG. 3A is a stream diagram of the flow of the inert gas around the cover 109, and FIG. 3B is a schematic contour diagram of the pressure distribution. In the schematic contour diagram of FIG. 3B, the darker the color, the higher the pressure; the lighter the color, the lower the pressure. The cover 109 serves as an obstacle against an ambient flow 119. Therefore, as shown in FIG. 3A, the ambient flow 119 collides against the cover 109 and changes its course. At this time, as shown in FIG. 3B, around the cover 109, the pressure against the ambient flow 119 is the highest on the upstream of the cover 109. Accordingly, ambient air or purge inert gas with a high impurity concentration tends to enter the inside of the cover 109 from the upstream of the ambient flow 119.

When an ambient flow is present in this manner, the inside of the cover 109 must be purged while considering the pressure distribution in the vicinity of the cover 109 as well. It is not easy to purge the inside of the cover 109 stably without being adversely affected by the ambient flow.

Although FIGS. 3A and 3B exemplify a case wherein the cover 109 has a rectangular shape, the same applies to a case wherein the cover 109 has a circular cylindrical shape or the like.

In view of the above situation, demands have arisen for a purge means that can increase the pressure inside the cover 109, particularly the pressure in the vicinity of the lower side of the supply port 106 formed inside the cover 109, to be higher than the pressure outside the cover 109, and a means that can stably purge the inside of the cover 109, even if the ambient flow 119 is present, without being adversely affected by the ambient flow 119.

Generally, the photonic energy of exposure light increases in inverse proportion to the wavelength of exposure light. Particularly, the photonic energy of a fluoride ($F_2$) excimer laser having an oscillation wavelength around 157 nm is as very large as 7.9 eV, and can disconnect molecule bonds constituting most resins. For this reason, when a resin-based photosensitive agent applied to the wafer is irradiated with exposure light, moisture adsorbed by the surface layer of the photosensitive agent evaporates, and part of the photosensitive agent decomposes and is highly likely released as impurities together with the moisture adsorbed by the surface layer of the photosensitive agent.

The impurities (to be referred to as released gas hereinafter) generated during exposure by the photosensitive agent itself applied to the wafer and by the moisture adsorbed by the surface of the photosensitive agent are recovered by the one-directional flow of the purge gas inside the cover 109. Due to the flow of the purge gas, the released gas forms a concentration gradient inside the cover 109. As the exposure light is absorbed by the released gas, as well, a transmittance loss distribution is formed in the exposure area due to the concentration gradient of the released gas.

The concentration distribution of the released gas, which occurs inside the cover 109, and the transmittance loss distribution in the exposure area will be described with reference to FIGS. 4A to 4C. FIGS. 4A and 4B are schematic contour diagrams of the concentration distribution of the released gas which is formed when gas release occurs during exposure. In the schematic contour diagram of FIG. 4A as a central sectional view of the inside of the cover 109 and that of FIG. 4B as a plan view, the darker the color, the higher the concentration of the released gas; the lighter the color, the lower the concentration of the released gas. As shown in FIGS. 4A and 4B, when gas release occurs during exposure, the concentration of the released gas is high and low on the downstream and upstream, respectively, of a purge gas flow 108 in the exposure area, thus forming a concentration gradient.

FIG. 4C is a schematic contour diagram of the transmittance loss in the exposure area when the concentration gradient shown in FIGS. 4A and 4B occurs. In the schematic contour diagram of FIG. 4C, the darker the color, the larger the transmittance loss; the lighter the color, the smaller the transmittance loss. As shown in FIG. 4C, when the released gas forms a concentration gradient during exposure, in the exposure area, the transmittance loss is small and large on the upstream and downstream, respectively, of the purge gas flow 108. Therefore, the exposure amount obtained in the exposure area during exposure forms a distribution, thus causing illuminance nonuniformity.

In this manner, when gas release occurs, illuminance nonuniformity occurs in the exposure area. A desired exposure amount may not be obtained in part of the exposure area, and the circuit pattern of the mask cannot be exposed sufficiently. As a result, the manufactured semiconductor devices include many defective products, and the productivity of the apparatus degrades. In view of this, demands have arisen for development of a purge means that does not cause illuminance nonuniformity during exposure even when a one-directional flow is present inside the cover 109.

SUMMARY OF THE INVENTION

The present invention has been made in view of the above problems, and has as its object to realize stable purging inside a cover that extends from the wafer-side end of a projection optical system toward the vicinity of a wafer stage to surround an exposure optical path.

According to one aspect of the present invention, there is provided an exposure apparatus for irradiating a photosensitive substrate arranged on a wafer stage with exposure light through a projection optical system, comprising: a cover which extends from a wafer-side end of the projection optical system toward a vicinity of the wafer stage to surround an exposure optical path; a first supply port through which purge gas formed of inert gas blows out inside the cover; a first recovery port through which the purge gas supplied through the first supply port is drawn by suction; and control means for blowing the purge gas through the first supply port and recovering the purge gas through the first recovery port to form a purge gas flow inside the cover, such that a flow rate of the purge gas recovered through the first recovery port is smaller than a flow rate of the purge gas supplied through the first supply port.

Also, according to another aspect of the present invention, there is provided an exposure apparatus for irradiating a photosensitive substrate arranged on a wafer stage with exposure light through a projection optical system, comprising: a cover which extends from a wafer-side end of the projection optical system toward a vicinity of the wafer stage to surround an exposure optical path; purge means, having, inside the cover, a first supply port through which the purge gas formed of inert gas blows out and a first recovery port through which the purge gas supplied through the first supply port is drawn by suction, for forming a purge gas flow inside the cover; and blow-out means for blowing out gas through a blow-out port formed outside the cover toward a space in the vicinity of a wafer stage, wherein the first supply port and blow-out port are arranged such that a flowing direction of the gas blowing out through the blow-out port and a direction of the purge gas flow oppose each other at an angle of not more than 90°.

Also, according to another aspect of the present invention, there is provided an exposure apparatus for irradiating a photosensitive substrate arranged on a wafer stage with exposure light through a projection optical system, comprising: a cover which extends from a wafer-side end of the projection optical system toward a vicinity of the wafer stage to surround an exposure optical path; a first supply port through which purge gas formed of inert gas blows out toward an inside of the cover; a second supply port which is formed in a lower portion of the cover and through which the purge gas blows out toward the wafer stage; and a first recovery port through which the purge gas supplied through the first and second supply ports is drawn by suction.

Furthermore, according to another aspect of the present invention, there is provided an exposure apparatus for irradiating a photosensitive substrate arranged on a wafer stage with exposure light through a projection optical system, comprising: a cover which extends from a wafer-side end of the projection optical system toward a vicinity of the wafer stage to surround an exposure optical path; a first supply port through which purge gas formed of inert gas blows out toward an inside of the cover; a first recovery port through which the purge gas supplied through the first supply port is drawn by suction; and a second recovery port which is formed at least in a lower portion of the cover and through which the purge gas is to be recovered in a direction from the stage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 18 is a diagram showing the schematic arrangement of the vicinity of a wafer in a projection exposure apparatus according to the sixth embodiment;

FIG. 22 is a diagram showing the schematic arrangement of the vicinity of a wafer in a projection exposure apparatus according to the eighth embodiment;

DETAILED DESCRIPTION OF THE PREFERRED EMBODIMENTS

Preferred embodiments of the present invention will now be described in detail in accordance with the accompanying drawings.

The arrangement of an exposure apparatus to which the present invention can be applied is not limited to the following embodiments. The present invention can be applied to any apparatus that irradiates a photosensitive substrate with a mask pattern through a projection optical system, and particularly to all known exposure apparatuses that use ultraviolet light as exposure light. While the ultraviolet light as the exposure light to be suitably used in the exposure apparatus according to the present invention is not particularly limited, the present invention is effective with an ArF excimer laser with a wavelength around far ultraviolet rays, particularly, 193 nm, and a fluorine ($F_2$) excimer laser with a wavelength around 157 nm.

(First Embodiment)

Figure 11:
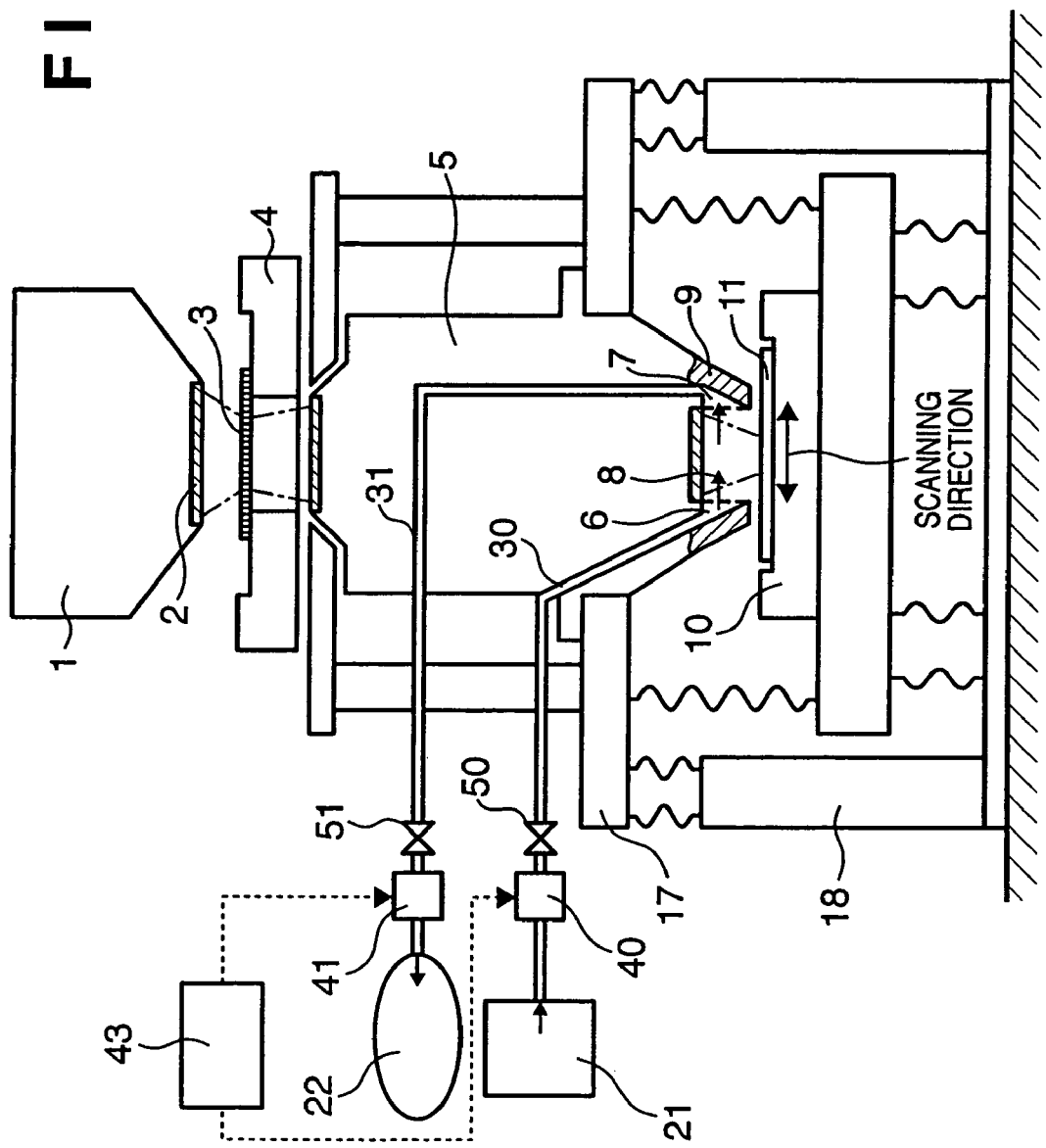
FIG. 11 is a diagram showing the schematic arrangement of the projection exposure apparatus according to the first embodiment.

FIG. 11 is a schematic diagram showing the main part of a step & scan type projection exposure apparatus according to the first embodiment.

Referring to FIG. 11, a reticle 3 placed on a reticle stage 4 is irradiated with ultraviolet light guided from an ultraviolet light source (not shown) to an illumination system 1 in the exposure apparatus. The pattern on the irradiated reticle 3 is reduced by a projection optical system 5 and forms an image on a wafer 11 placed on a wafer stage 10. The wafer 11 is coated with a photosensitive agent, and the pattern is transferred to the wafer 11 by reduction and image formation. A cover 9 extends from the wafer-side end of the projection optical system 5 toward the vicinity of the wafer stage 10 to surround the ultraviolet light. A supply port 6 through which purge gas flows out is formed in one side of the cover 9, and a recovery port 7 through which the purge gas is drawn by suction is formed in the other side of the cover 9. Inside the cover 9, the purge gas flows in one direction (8). As the purge gas, inert gas such as nitrogen, helium, or argon is used. The purge gas is supplied from a purge gas supply unit 21 via a pipe 30 to the inside of the cover 9 through the supply port 6.

A flow controller 40 is provided between the purge gas supply unit 21 and supply port 6. The flow controller 40 supplies the purge gas to the supply port 6 at a flow rate in accordance with control information from a main control system 43. A vacuum pump 22 which recovers the purge gas inside the cover 9 is connected to the recovery port 7 through a pipe 31. A flow controller 41 is provided between the recovery port 7 and vacuum pump 22. The flow controller 41 recovers the purge gas through the recovery port 7 at a flow rate in accordance with control information from the main control system 43. In the flow controllers 40 and 41, valves 50 and 51, respectively, open and close at predetermined timings on the basis of the control information from the main control system 43.

The supply port 6 uses a porous plate having, e.g., small holes, at constant pitches, or a porous body such as a sintered material, foamed material, or fiber material made of a metal, resin, or mineral, which is utilized in a filter, or the like, so that the purge gas flowing through the pipe 30 is straightened. The recovery port 7 also uses a porous plate or porous body, in the same manner as the supply port 6 does, so that the flow of the purge gas in the vicinity of the recovery port 7 is straightened. Straightening of the purge gas with the porous plate or porous body aims to make uniform the flow velocity distribution of the purge gas in the plane of the supply port 6 or recover port 7, and to make uniform fluctuations in the flow velocity along the time axis by suppressing disturbance of the flow, so that the flow forms a laminar flow more and that a stable purging performance can be obtained.

In the exposure apparatus according to the first embodiment as described above, when the inside of the cover 9 is to be purged, first, control information is transmitted from the main control system 43 to the flow controller 40 to open the valve 50. The purge gas is supplied to the inside of the cover 9 through the supply port 6 at a predetermined flow rate. After that, control information is transmitted from the main control system 43 to the flow controller 41 to open the valve 51. The purge gas is recovered through the recovery port 7 at a predetermined flow rate. At this time, the control information is transmitted from the main control system 43 to the flow controller 41 such that the flow rate of the purge gas recovered through the recovery port 7 is smaller than the flow rate of the purge gas supplied through the supply port 6. As the recovery flow rate of the purge gas is set smaller than the supply flow rate, the purge gas flows out from the inside of the cover 9 to the outside of the cover 9. The pressure inside the cover 9 thus becomes higher than the pressure outside the cover 9, so that the inside of the cover 9 can be purged stably. For example, according to the experiments by the inventor, the inside of the cover 9 could be purged at a ratio of "supply flow rate through supply port 6":"recovery flow rate through recovery port 7"=5:4. Obviously, the inside of the cover 9 can be purged at other flow rate ratios (e.g., supply flow rate:recovery flow rate=3:2 or 2:1).

According to the first embodiment, the flow rates at both the supply port 6 and recovery port 7 are controlled. Alternatively, either one flow rate may be fixed, and only the other flow rate may be changed. Generally, when the pressure at the inlet is mechanically maintained at a constant value by using a regulator or the like, the flow rate can be fixed to a constant value comparatively easily to a certain degree. Therefore, for example, the pressure at either one inlet of the supply port 6 and recovery port 7 may be maintained at a constant value so that its flow rate is fixed to a preset value, while only the other flow rate may be controlled on the basis of the control information (information for flow rate control on the basis of the recovery amount and supply amount).

In the exposure apparatus according to the first embodiment, the supply port 6 is formed inside the cover 9 such that the purge gas flows parallel to the scanning direction of exposure. Therefore, even if the gas released from a resist or the like during exposure forms a transmittance loss distribution, the transmittance loss is averaged during scanning, and the illuminance nonuniformity is decreased. Depending on the positions of the respective types of units that constitute the exposure apparatus, sometimes the flow of the purge gas cannot be set parallel to the scanning direction. Even in this case, the inside of the cover 9 can still be purged stably.

In the exposure apparatus according to the first embodiment, the supply port 6 is arranged such that the purge gas flows parallel to the scanning direction of exposure. In the exposure apparatuses according to the second to ninth embodiments to be described below as well, the supply port 6 is desirably arranged such that the purge gas flows parallel to the scanning direction of exposure, in the same manner as in the exposure apparatus of the first embodiment. Then, illuminance nonuniformity during scanning can be decreased also in the exposure apparatuses according to the second to ninth embodiments.

FIGS. 10A to 10D show differences in transmittance loss distribution that occur during scanning, between a case wherein the supply port 6 is arranged inside the cover 9 such that the purge gas flows parallel to the scanning direction of exposure, and a case wherein the supply port 6 is arranged inside the cover 9 such that the purge gas flows perpendicularly to the scanning direction of exposure. In FIGS. 10A to 10D, the darker the color, the larger the transmittance loss; the lighter the color, the smaller the transmittance loss.

Figure 10B:
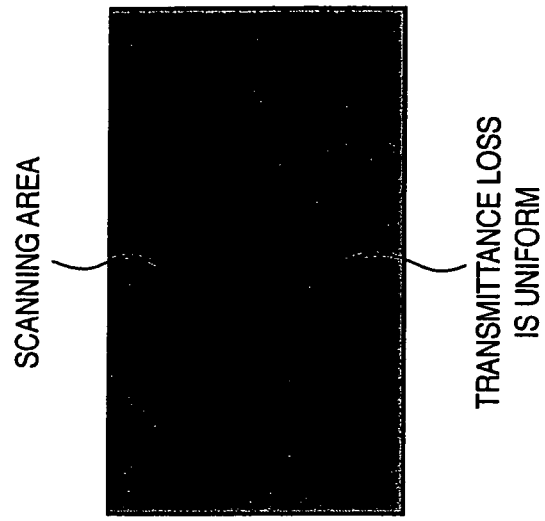
FIGS. 10A and 10B are diagrams showing transmittance loss distributions in the exposure area and scanning area, respectively, of a projection exposure apparatus according to the first embodiment.
Figure 10A:
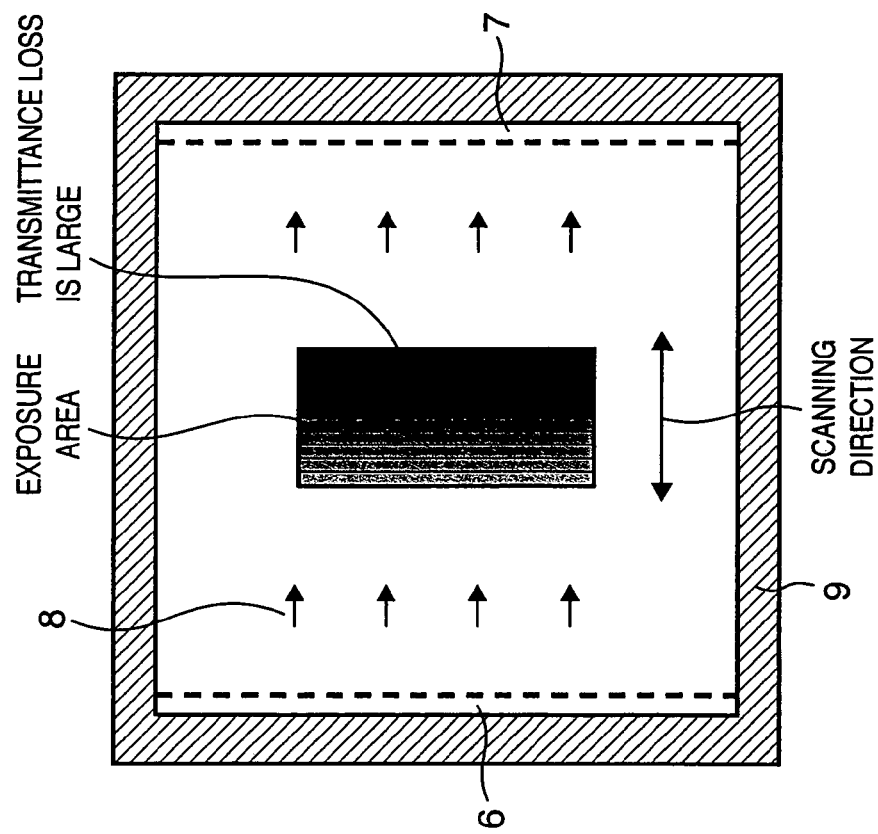
Figure 10D:
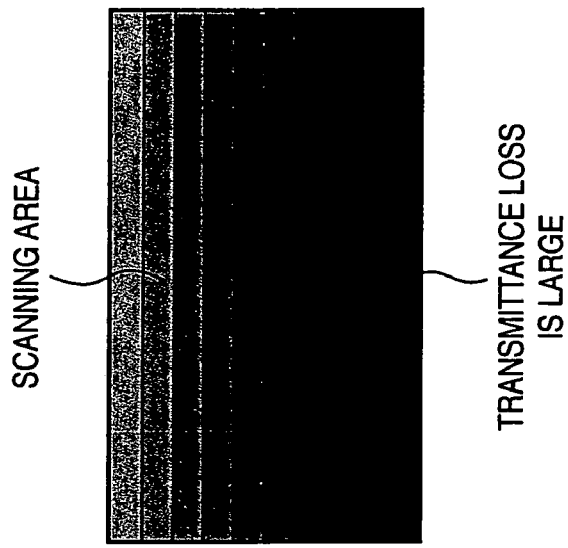
FIGS. 10C and 10D are diagrams showing transmittance loss distributions in the exposure area and scanning area, respectively, when the scanning direction and the flowing direction of the purge gas are perpendicular to each other.
Figure 10C:
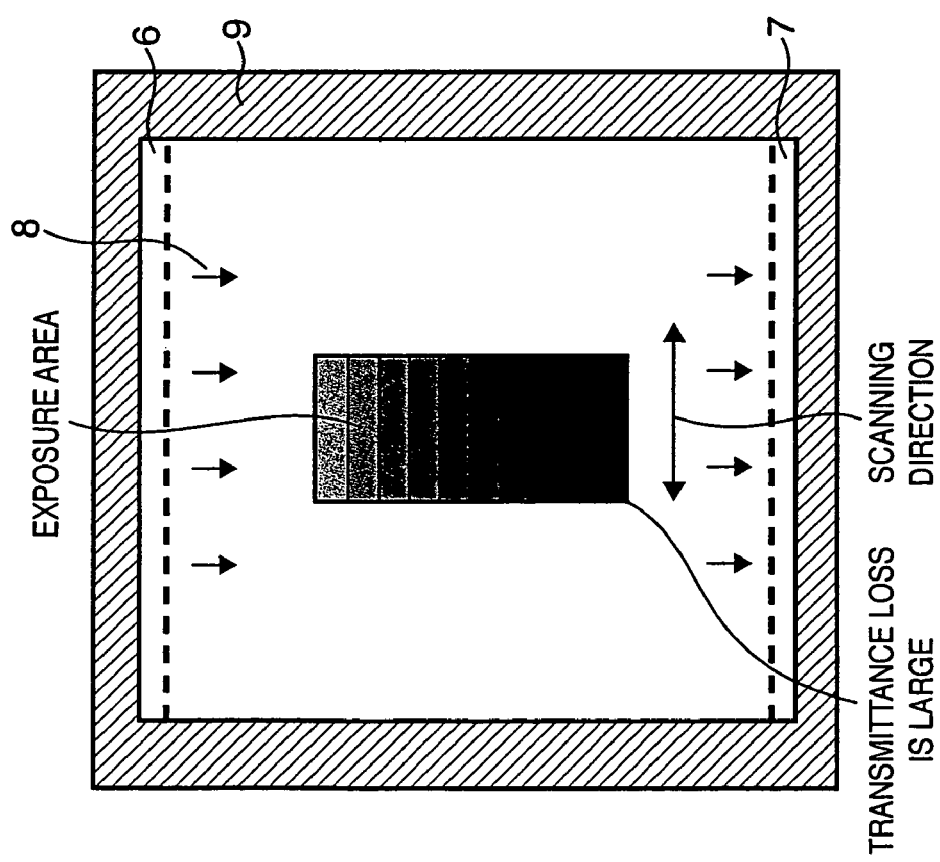

FIGS. 10A and 10C are schematic contour diagrams of the transmittance loss in the exposure area, and FIGS. 10B and 10D are schematic contour diagrams of the transmittance loss that occurs when scanning is performed with the transmittance loss distributions of FIGS. 10A and 10C, respectively.

As shown in FIGS. 10A and 10B, when the supply port 6 is arranged such that the purge gas flows parallel to the scanning direction of exposure, scanning can make uniform the transmittance loss distribution in the exposure area. The transmittance loss in the scanned area becomes uniform, and no illuminance nonuniformity occurs. As shown in FIGS. 10C and 10D, when the supply port 6 is arranged such that the purge gas flows perpendicularly to the scanning direction of exposure, scanning cannot make uniform the transmittance loss distribution in the exposure area. A transmittance loss distribution is formed also in the scanned area, and illuminance nonuniformity occurs. Therefore, to prevent illuminance nonuniformity during scanning, the flowing direction of the purge gas is preferably set to be parallel to the scanning direction. Then, the exposure amount obtained in the scanning area becomes uniform. No defective product will occur among the manufactured semiconductor devices. As a result, the high productivity of the apparatus can be maintained.

As described above, the exposure apparatus according to the first embodiment is an exposure apparatus for irradiating a photosensitive substrate (11) arranged on a wafer stage (10) with exposure light through a projection optical system (5), and has a cover (9) which extends from the wafer-side end of the projection optical system (5) toward the vicinity of the wafer stage (10) to surround an exposure optical path, a supply port (6) through which purge gas formed of inert gas blows out inside the cover (9), and a recovery port (7) through which the purge gas supplied through the supply port (6) is drawn by suction. The purge gas blows out through the supply port (6) and is recovered through the recovery port (7) to form a purge gas flow inside the cover (9). Control operation is performed (43) such that the flow rate of the purge gas recovered through the recovery port (7) is smaller than the flow rate of the purge gas supplied through the supply port (6).

In this manner, when the recovery flow rate of the purge gas is set smaller than its supply flow rate, the purge gas flows out from the inside of the cover 9 to the periphery of the cover 9, and the pressure inside the cover 9 can be set higher than the pressure outside the cover 9, so that external gas can be prevented from entering.

In the above control operation, a first pressure sensor which measures the pressure inside the cover (9) and a second pressure sensor which measures the pressure outside the cover (9) may be provided. The flow rate of the purge gas supplied through the supply port (6) and/or the flow rate of the purge gas recovered through the recovery port (7) may be controlled, on the basis of the measurement results of the first and second pressure sensors, such that the pressure inside the cover (9) is higher than the pressure outside the cover. An arrangement including the above pressure sensors will be described in detail in the ninth embodiment.

(Second Embodiment)

In the second embodiment, the influence of the gas, supplied from the outside of the cover 9, on purging, is decreased.

Figure 12:
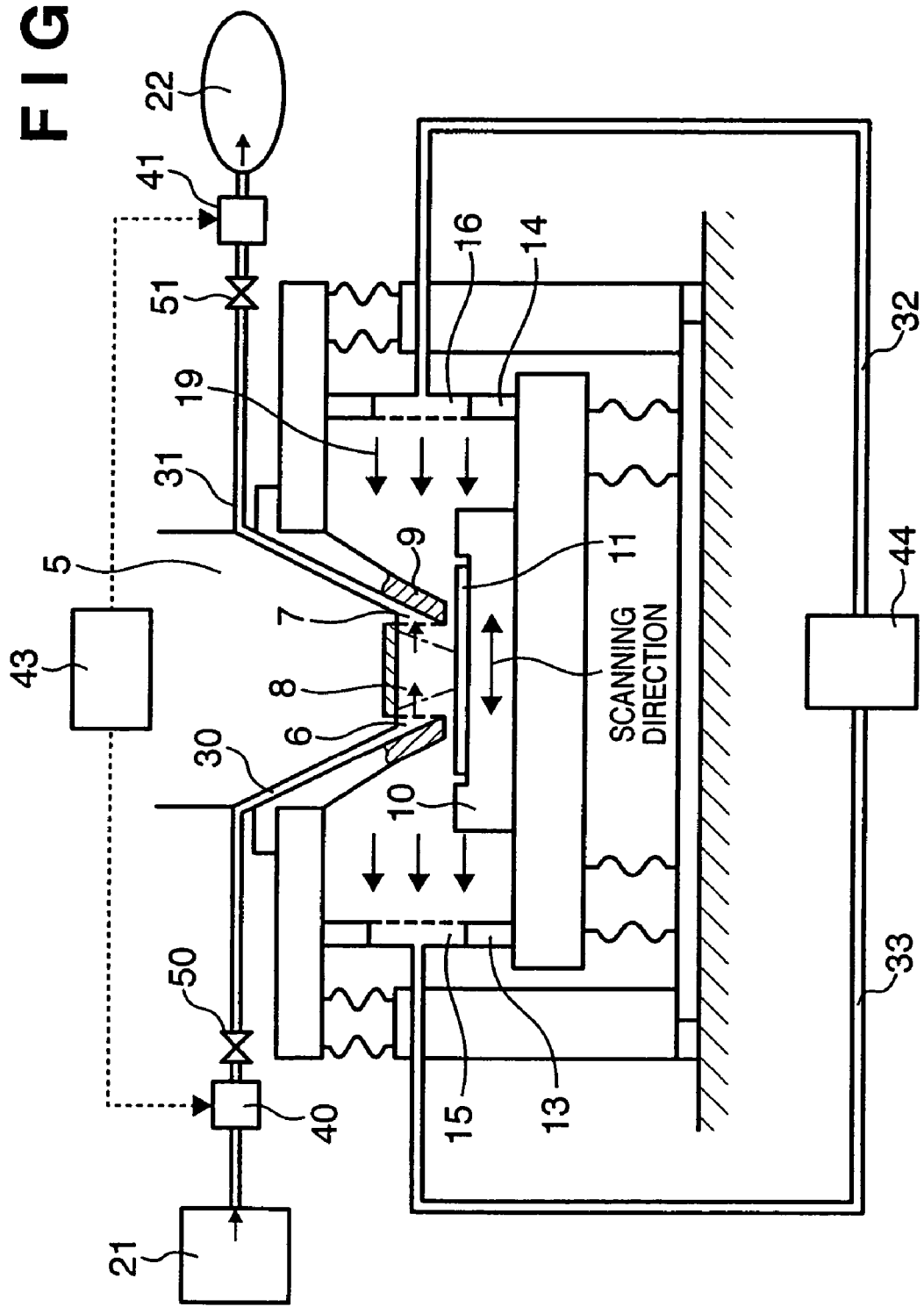
FIG. 12 is a diagram showing the schematic arrangement of the vicinity of a wafer in a projection exposure apparatus according to the second embodiment.

FIG. 12 is a diagram for explaining the schematic arrangement of an exposure apparatus according to the second embodiment. The second embodiment exemplifies a case wherein a cover 9 having a supply port 6 and recovery port 7 is placed in the one-directional flow (ambient flow) of air or gas having a comparatively high impurity concentration. Flow rate control of the purge gas supplied/recovered through the supply port 6/recovery port 7 is the same as that of the first embodiment, and a description thereof will be omitted.

Referring to FIG. 12, a partition wall 14 has a blow-out port 16 through which the gas blows out toward the space in the vicinity of a wafer stage, and a partition wall 13 opposing the partition wall 14 has a suction port 15 through which the gas is drawn by suction. As the gas to be supplied through the blow-out port 16, at least temperature- or humidity-adjusted air or temperature- or humidity-adjusted inert gas having a higher impurity concentration than that of purge gas to be supplied to inside the cover 9 is used. A gas circulating unit 44 constituted by a blower and temperature controller is connected to the blow-out port 16 and suction port 17 through pipes 32 and 33, respectively.

According to the exposure apparatus of the second embodiment, the blower provided in the gas circulating unit 44 blows the gas, and the gas flows through the pipe 32 and blows out through the blow-out port 16 toward the space in the vicinity of the wafer stage. The blown-out gas flows through the pipe 33 and is recovered by the gas circulating unit 44 through the suction port 15. The gas recovered by the gas circulating unit 44 is controlled to a predetermined temperature by the temperature controller provided in the gas circulating unit 44, is blown again by the blower, and flows through the pipe 32 and blows out through the blow-out port 16 toward the space in the vicinity of the wafer stage. In this manner, since the temperature-controlled gas is supplied through the blow-out port 16 toward the space in the vicinity of the wafer stage and is recovered through the suction port 15, one-directional gas flow (to be referred to as an ambient flow 19 hereinafter) is formed around the cover 9, so that the temperature, humidity, and the like around the wafer stage are kept at predetermined values. Since the gas to flow in the space in the vicinity of the wafer stage is circulated using the gas circulating unit 44, the total flow rate of the gas used by the exposure apparatus can be reduced, and the operation cost of the apparatus can be reduced.

Figure 5A:
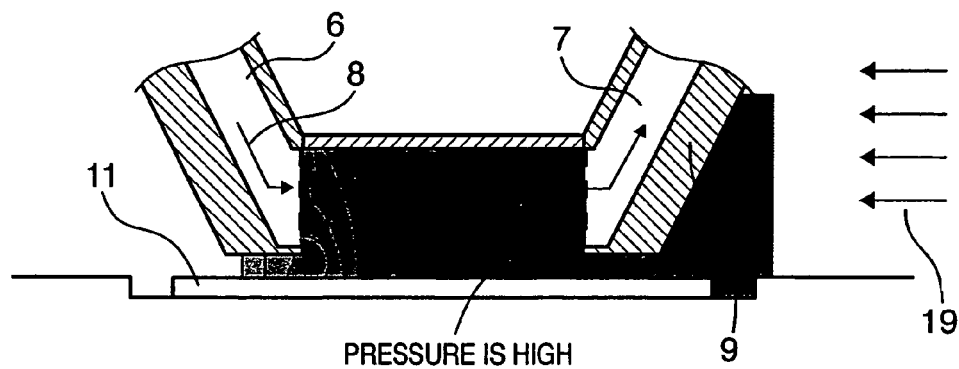
FIGS. 5A and 5B are diagrams showing the pressure distribution of purge gas in the vicinity of a wafer in a projection exposure apparatus according to the second embodiment.
Figure 5B:
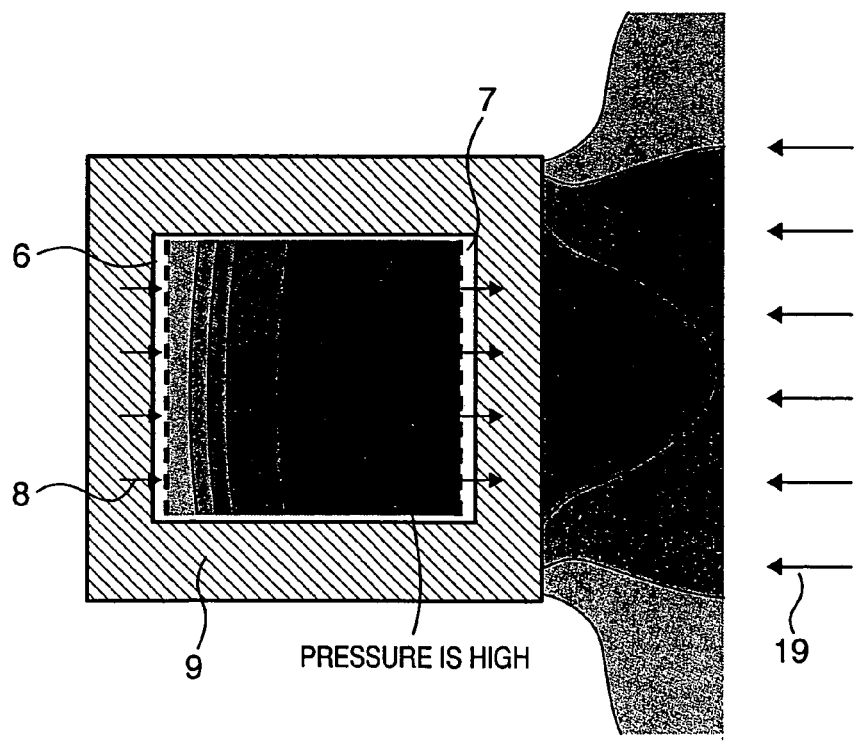

According to the exposure apparatus of the second embodiment, the supply port 6 is arranged such that the direction of the flow of the gas (ambient flow 19) blowing out through the blow-out port 16 and the direction of the flow of the purge gas blowing out through the supply port 6 are just opposite to each other ("just opposite" will be described later). If the supply port 6 is formed such that the ambient flow 19 and a purge gas flow 8 are just opposite to each other, the pressure distribution as shown in FIGS. 5A and 5B is obtained in the vicinity of the cover 9. That portion inside the cover 9 where the pressure is the highest and that portion outside the cover 9 where the pressure is the highest oppose each other. Therefore, the ambient flow 19 can be prevented from flowing to inside the cover 9, so that the inside of the cover 9 can be purged stably.

FIGS. 5A and 5B are schematic contour diagrams of the pressure distribution in the vicinity of the cover 9, which is formed when the supply port 6 is arranged such that the direction of the flow of the gas (ambient flow 19) blowing out through the blow-out port 16 and the direction of the flow of the purge gas blowing out through the supply port 6 are just opposite to each other. In the schematic contour diagrams of FIGS. 5A and 5B, the darker the color, the higher the pressure; the lighter the color, the lower the pressure. Referring to FIG. 5A as the sectional view taken at the center of the cover 9 and FIG. 5B as the plan view, the purge gas blows out through the supply port 6 in the direction of arrows (8) toward the vicinity of a wafer 11. Part of the blowing purge gas is drawn by suction through the recovery port 7, and the remaining gas flows out to the portion around the cover 9 through the gap between the cover 9 and wafer 11. When the supply port 6 is arranged such that the ambient flow 19 and the purge gas flow 8 are just opposite to each other, that portion inside the cover 9 where the pressure is the highest and that portion outside the cover 9 where the pressure is the highest oppose each other, as shown in FIGS. 5A and 5B. Therefore, the flow of the purge gas inside the cover 9 serves as a resistance against air or purge inert gas with a high impurity concentration entering from the periphery. As a result, air or purge gas with a high impurity concentration does not enter from the periphery, and the inside of the cover 9 can be stably purged.

Figure 6:
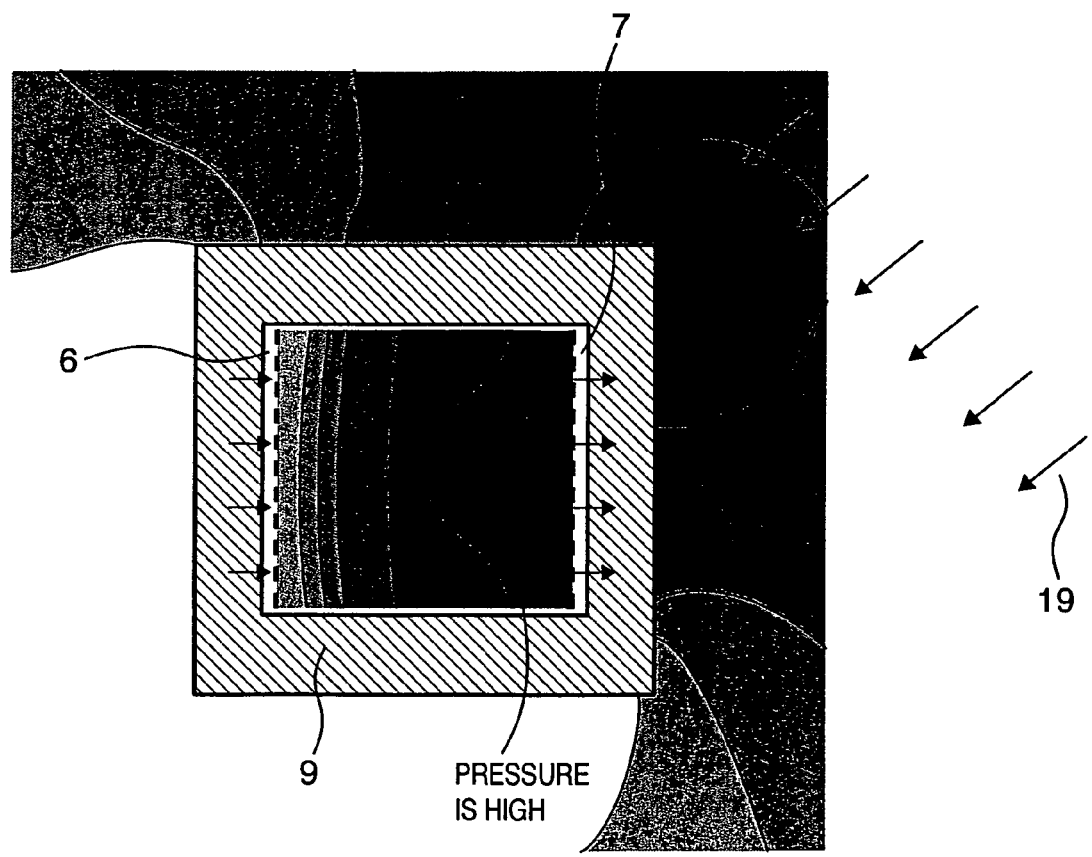
FIG. 6 is a diagram showing the pressure distribution of the purge gas in the vicinity of the wafer in the projection exposure apparatus according to the second embodiment.

In the second embodiment, the supply port 6 is formed such that the ambient flow 19 and the purge gas flow 8 are just opposite to each other. The same effect can be obtained as far as the angle formed by the respective flows is 90° or less. In particular, the supply port 6 is preferably arranged such that the angle formed by the respective flows is 45° or less. In this case, a better result can be obtained. As far as the angle formed by the respective flows is 45° or less, that portion outside the cover 9 where the pressure is the highest and that portion inside the cover 9 where the pressure is the highest substantially oppose each other, as shown in FIG. 6. As a result, the same effect as that obtained when the supply port 6 is formed such that the ambient flow 19 and the purge gas flow 8 are just opposite to each other can be obtained.

FIG. 6 is a schematic contour diagram of the pressure distribution in the vicinity of the cover 9 which is formed when the supply port 6 is arranged such that the ambient flow 19 and the purge gas flow 8 form a predetermined angle (about 45°). In the schematic contour diagram of FIG. 6, the darker the color, the higher the pressure; the lighter the color, the lower the pressure. Even if the direction of the ambient flow 19 and the direction of the purge gas flow 8 are not just opposite to each other, as far as the angle formed by the respective flows is approximately 45° or less, that portion outside the cover 9 where the pressure is the highest and that portion inside the cover 9 where the pressure is the highest can be set to substantially oppose each other, as shown in FIG. 6. Therefore, the purge gas flow inside the cover 9 can serve as a resistance against air or purge inert gas with a high impurity concentration entering from the periphery. Thus, the inside of the cover 9 can be purged stably.

As described above, the exposure apparatus according to the second embodiment is an exposure apparatus (FIG. 12) for irradiating a photosensitive substrate arranged on a wafer stage with exposure light through a projection optical system, and has a cover (9) which extends from the wafer-side end of the projection optical system (5) toward the vicinity of the wafer stage 10) to surround an exposure optical path. A purge gas flow is formed inside the cover (9) by using a first supply port (6) through which the purge gas formed of inert gas blows out inside the cover (9), and a recovery port (7) through which the purge gas supplied through the supply port (6) is drawn by suction. The gas blows out through a blow-out port (16) formed outside the cover (9) toward the space in the vicinity of the wafer stage (10). The first supply port (6) and blow-out port (16) are arranged such that the flowing direction of the gas blowing out through the blow-out port (16) and the direction of the purge gas flow oppose each other at an angle of 90° or less.

According to this arrangement, that portion inside the cover 9 where the pressure is high and that portion outside the cover 9 where the pressure is high oppose each other, as described above. The purge gas flow inside the cover 9 serves as a resistance against air or purge inert gas with a high impurity concentration entering from the periphery. Therefore, air or purge gas with a high impurity concentration does not enter from the periphery, and the inside of the cover 9 can be purged stably.

Preferably, the angle formed by the opposing directions is 45° or less. More preferably, the angle formed by the opposing directions is 0° (the flowing direction of the gas blowing out through the blow-out port (16) and the direction of the purge gas flow are just opposite to each other).

Preferably, the gas blowing out through the blow-out port (16) is formed of air, or inert gas having a higher impurity concentration than the purge gas. The role of the gas blowing out through the blow-out port 16 toward the space in the vicinity of the wafer stage is to maintain the temperature, humidity, and the like, around the wafer stage to predetermined values. Hence, the gas, which is to blow out through the blow-out port 16, need not be one having a high impurity like purge gas, but can be air, or inert gas having a higher impurity concentration than the purge gas.

(Third Embodiment)

In the third embodiment, in addition to the supply port 6 inside the cover 9, a sub-supply port is formed through which purge gas is so supplied as to prevent the external gas from entering.

Figure 13:
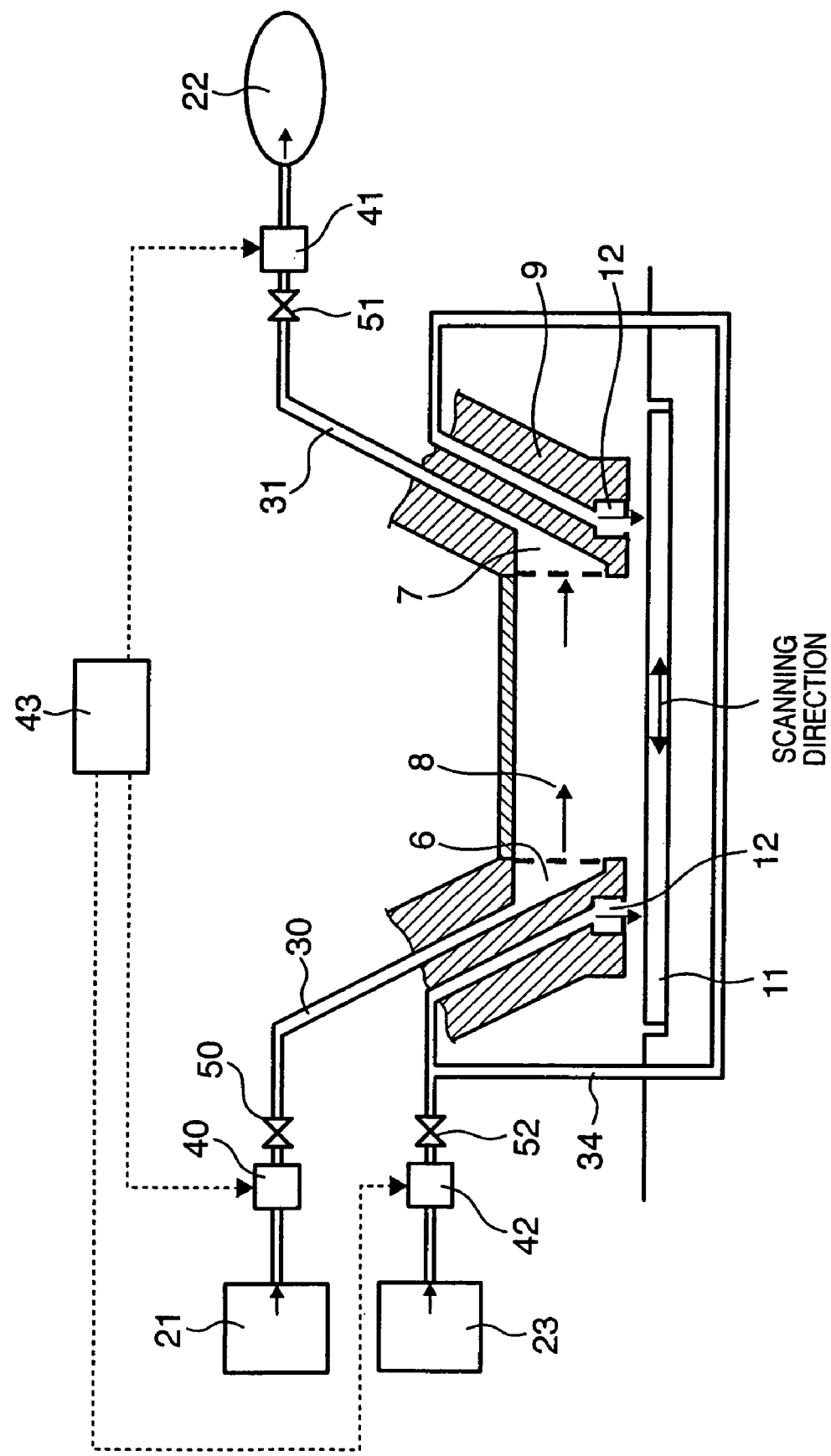
FIG. 13 is a diagram showing the schematic arrangement of the vicinity of a wafer in a projection exposure apparatus according to the third embodiment.

FIG. 13 is a diagram showing the arrangement of the main part of an exposure apparatus according to the third embodiment. As shown in FIG. 13, a supply port 6 and recovery port 7 are formed inside a cover 9. A sub-supply port 12 is formed in the lower end of the cover 9. The purge gas is supplied through the sub-supply port 12 toward a wafer 11. Flow rate control of the purge gas supplied/recovered through the supply port 6 and recovery port 7 is the same as that of the first embodiment, and a description thereof will accordingly be omitted.

According to the third embodiment, the sub-supply port 12 is formed to surround the periphery of the exposure area, and the purge gas supplied through the sub-supply port 12 is inert gas with an impurity concentration decreased to the same level as that of the purge gas supplied through the supply port 6. The purge gas to be supplied through the sub-supply port 12 is supplied from a purge gas supply unit 23 through a pipe 34, and is supplied through the sub-supply port 12 toward the wafer 11. A flow controller 42 is provided between the purge gas supply unit 23 and sub-supply port 12. The purge gas is supplied to the sub-supply port 12 at a flow rate in accordance with control information from a main control system 43. In the flow controller 42, a valve 52 opens and closes at predetermined timings on the basis of the control information from the main control system 43. In order to straighten the purge gas flowing from the pipe 34, the sub-supply port 12 uses a porous plate or porous material.

In the exposure apparatus according to the third embodiment, when the inside of the cover 9 is to be purged, first, control information is transmitted from the main control system 43 to a flow controller 40 and the flow controller 42 to open a valve 50 and the valve 52, respectively. The purge gas is supplied at predetermined flow rates through the supply port 6 and sub-supply port 12. After that, the control information is transmitted from the main control system 43 to a flow controller 41 to open a valve 51. The purge gas is recovered at a predetermined flow rate through the recovery port 7.

At this time, the control information is transmitted from the main control system 43 to the flow controller 41 such that the flow rate of the purge gas recovered through the recovery port 7 is less than the total flow rate of the flow rate of the purge gas supplied through the supply port 6 and the flow rate of the purge gas supplied through the sub-supply port 12. Hence, part of the purge gas supplied through the sub-supply port 12 flows to inside the cover 9 to prevent generation of a whirl in the vicinity of the lower side of the supply port 6. The remaining purge gas flows out to the periphery of the cover 9 through the gap between the cover 9 and wafer 11, and serves as a resistance against air or purge inert gas with a high impurity concentration that enters inside the cover 9. Therefore, as shown in FIGS. 7A and 7B, a pressure P3 inside the cover 9 is made uniform and becomes much higher than a pressure P2 outside the cover 9, so that the inside of the cover 9 can be stably purged.

In the third embodiment, the flow rates at the supply port 6, sub-supply port 12, and recovery port 7 are controlled, respectively. Alternatively, the pressure at either one or two ports may be maintained at constant values so that the flow rates there may be fixed to preset values, and the flow rate at the remaining port may be controlled on the basis of the control information.

Figure 1:
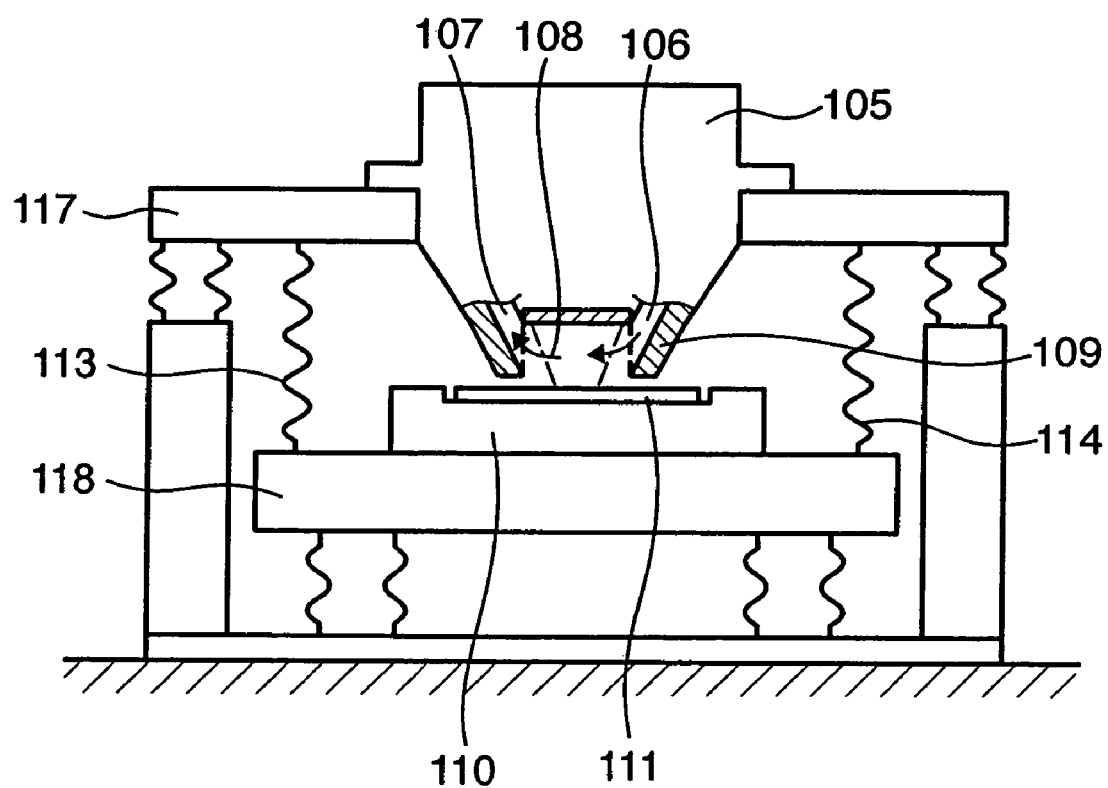
FIG. 1 is a view showing an example of a general purge means.
Figure 2A:
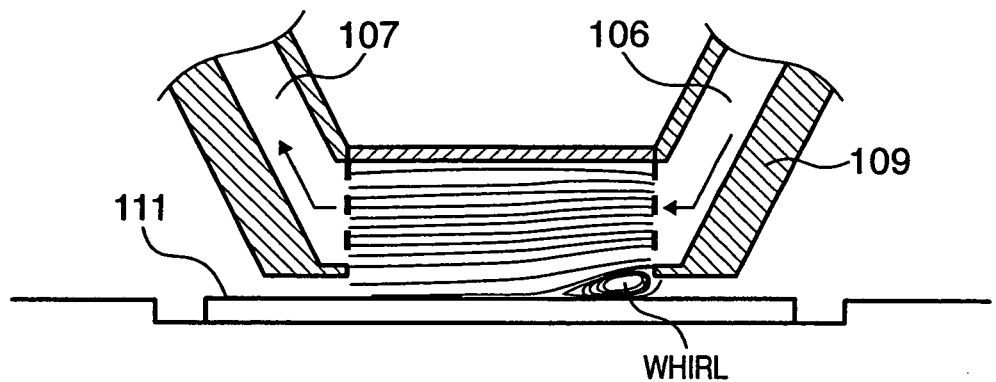
FIG. 2A is a stream diagram of inert gas in the vicinity of a wafer when a general purge means is used.
Figure 2B:
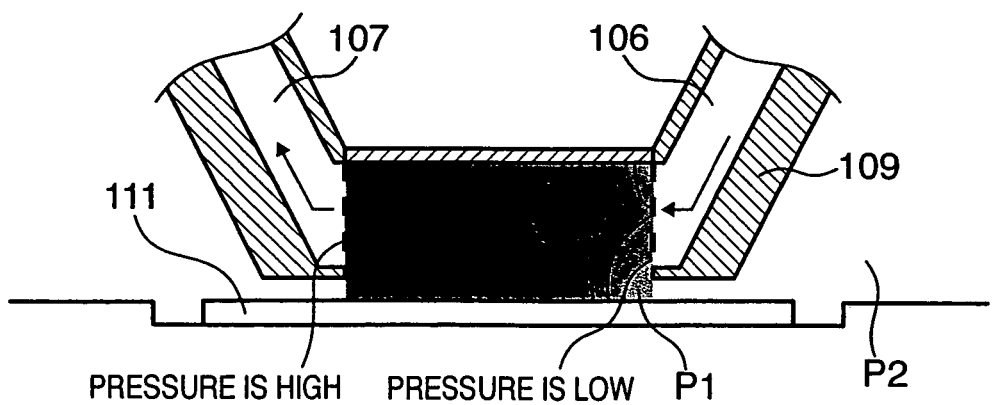
FIG. 2B is a pressure distribution diagram of the inert gas in the vicinity of the wafer when the general purge means is used.

The effect obtained when the sub-supply port 12 is formed in the lower end of the cover 9 to surround the periphery of the exposure area will be described with reference to FIGS. 2A and 2B and FIGS. 7A and 7B. When a gap is present between the cover 9 and wafer 11, a whirl is generated in the vicinity of the lower side of the supply port 6 (106), as shown in FIGS. 2A and 2B, and the pressure decreases. Accordingly, in the vicinity of the lower side of the supply port 6 (106), impurities enter from the periphery of the cover 9 (109). The impurity concentration inside the cover 9 (109) degrades, and the productivity of the apparatus degrades.

Figure 7A:
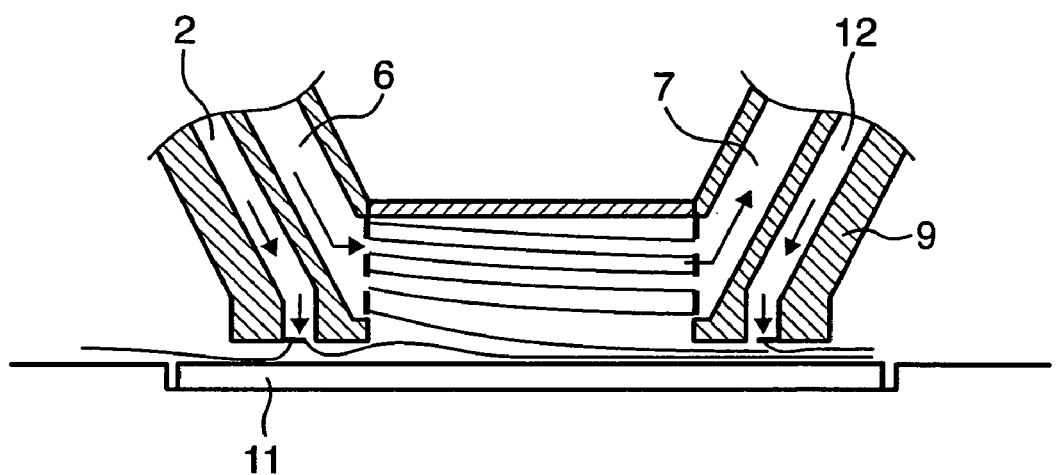
FIG. 7A is a stream diagram showing the flow of purge gas in the vicinity of a wafer in a projection exposure apparatus according to the third embodiment.
Figure 7B:
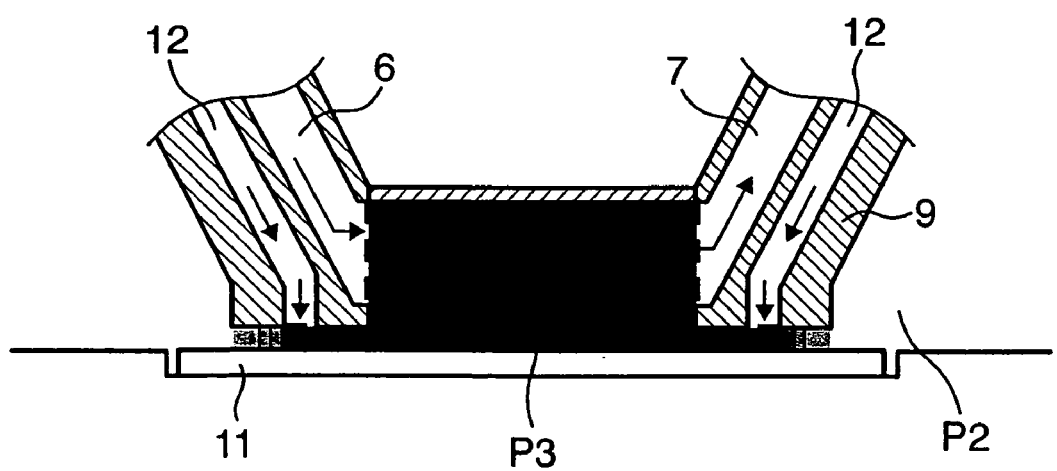
FIG. 7B is a diagram showing the pressure distribution of the purge gas in the vicinity of the wafer in the projection exposure apparatus according to the third embodiment.

In contrast to this, FIG. 7A is a stream diagram of the purge gas in the section taken at the center of the inside of the cover 9 when the sub-supply port 12 is formed to surround the periphery of the exposure area, and FIG. 7B is a schematic contour diagram of the pressure distribution taken at the same location as that of FIG. 7A. In the schematic contour diagram of FIG. 7A, the darker the color, the higher the pressure; the lighter the color, the lower the pressure.

The flow in the vicinity of the lower side of the supply port 6 and the pressure distribution will be described first. As shown in FIG. 7A, when the sub-supply port 12 is formed in the lower end of the cover 9, what enters the vicinity of the lower side of the supply port 6 is the purge gas supplied through the sub-supply port 12. The impurity concentration inside the cover 9 does not degrade accordingly, and purging inside the cover 9 is maintained. When the purge gas is further supplied through the sub-supply port 12, a flow of the purge gas is generated from the sub-supply port 12 toward the inside of the cover 9, so that no whirl is generated in the vicinity of the lower side of the supply port 6. Therefore, as shown in FIG. 7B, the pressure does not decrease in the vicinity of the lower side of the supply port 6, and the pressure P3 inside the cover 9 becomes uniform, so that the inside of the cover 9 can be purged stably.

The effect obtained when a purge gas supply port is formed to surround the periphery of the exposure area will be described. When the sub-supply port 12 is formed in the lower end of the cover 9 to surround the periphery of the exposure area, most of the purge gas supplied through the sub-supply port 12 flows out to the periphery of the cover 9 through the gap between the cover 9 and wafer 11. In other words, the purge gas supplied through the sub-supply port 12 flows out to the periphery of the cover 9 radially. Thus, the purge gas supplied through the sub-supply port 12 serves as a resistance against the air or purge inert gas with a high impurity concentration entering from the periphery, and the pressure P3 inside the cover 9 becomes very high. Thus, the inside of the cover 9 can be purged more stably.

As described above, the exposure apparatus according to the third embodiment is an exposure apparatus (FIG. 13) for irradiating a photosensitive substrate arranged on a wafer stage with exposure light through a projection optical system, and comprises a cover (9) which extends from the wafer-side end of the projection optical system (5) toward the vicinity of the wafer stage (10) to surround an exposure optical path, a first supply port (6) through which purge gas formed of inert gas blows out toward the inside of the cover (9), a second supply port (12) which is formed in the lower portion of the cover (9) and through which the purge gas blows out toward the wafer stage (10), and a first recovery port (7) through which the purge gas supplied from the first and second supply ports (6 and 12) is drawn by suction.

According to the above arrangement, the purge gas supplied through the second supply port (12) collides against the photosensitive substrate (11) and flows radially along the surface of the photosensitive substrate. Part of the purge gas flows out to the outside of the cover (9) and serves as a resistance against air or purge inert gas with a high impurity concentration that enters from the periphery of the cover (9). As a result, the inside of the cover 9 can be purged stably.

In particular, when the flow rate of the purge gas recovered through the first recovery port (7) is set smaller than the total flow rate of the purge gas supplied through the first and second supply ports (6 and 12), purging becomes more stable. The second supply port is preferably formed to surround the periphery of the exposure area.

(Fourth Embodiment)

In the third embodiment, the sub-supply port 12 is so formed in the lower end of the cover 9 as to surround the periphery of the exposure area. In the fourth embodiment, as shown in FIG. 14, a sub-supply port 12 is formed in the lower end of a cover 9 in the vicinity of a supply port 6.

Figure 14:
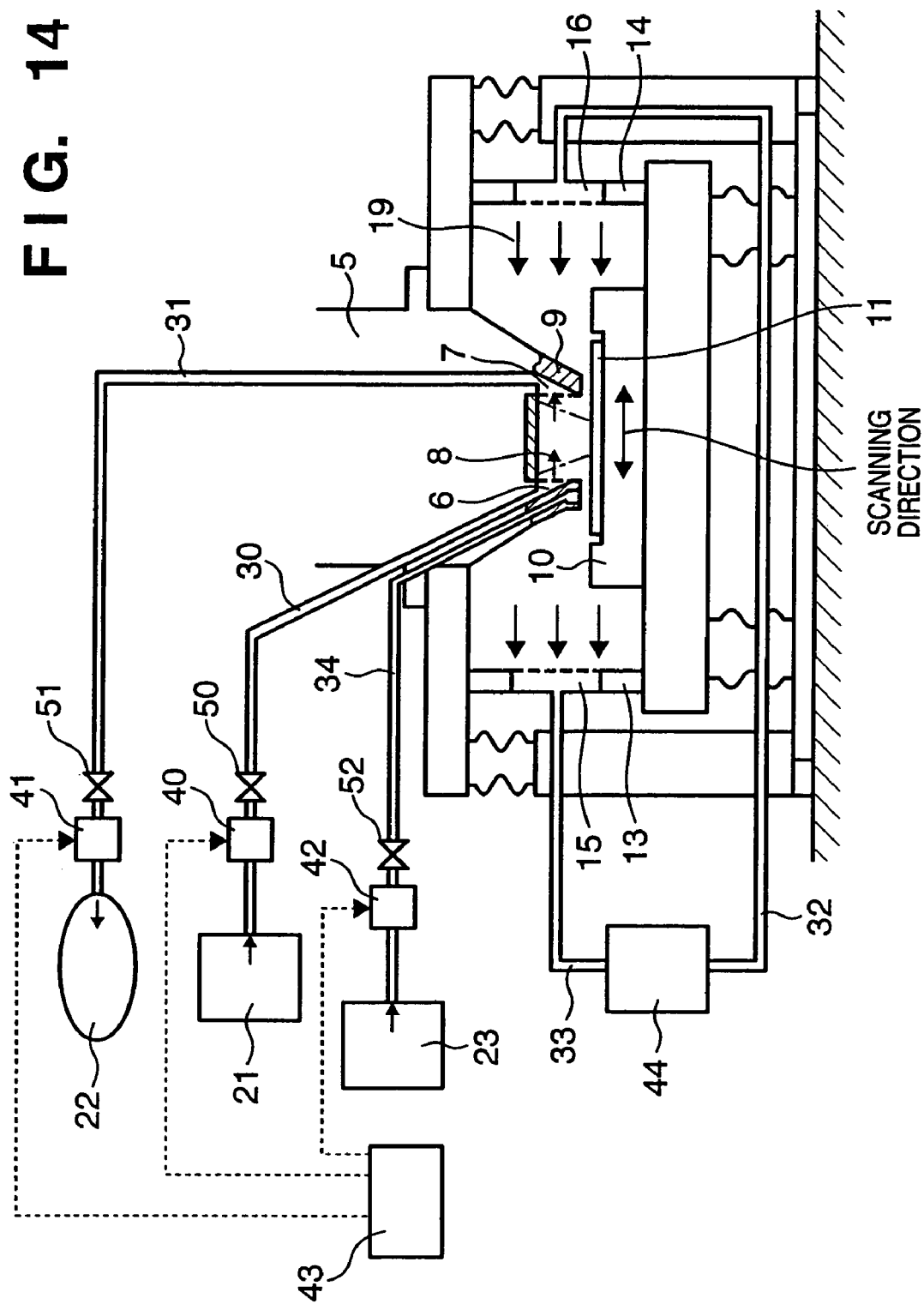
FIG. 14 is a diagram showing the schematic arrangement of the vicinity of a wafer in a projection exposure apparatus according to the fourth embodiment.

FIG. 14 is a diagram for explaining the arrangement of an exposure apparatus according to the fourth embodiment. Inside the cover 9, in addition to the supply port 6 and a recovery port 7, the sub-supply port 12 is formed only in the lower end of the cover 9 in the vicinity of the supply port 6. In FIG. 14, a blow-out port 16 and suction port 15 are formed in partition walls 14 and 13, respectively, so that the cover 9 is disposed in an ambient flow 19. In FIG. 14, the same reference numerals as in FIGS. 11 to 13 denote the same constituent elements. The flow rate control and a purging method inside the cover 9 of the fourth embodiment are described in the first to third embodiments, and a description thereof will be omitted.

In the exposure apparatus of the fourth embodiment, the supply port 6 is formed such that the ambient flow 19 and a purge gas flow 8 are just opposite to each other. Control information is transmitted from a main control system 43 to a flow controller 41 such that the flow rate of the purge gas recovered through the recovery port 7 is less than the total flow rate of the flow rate of the purge gas supplied through the supply port 6 and the flow rate of the purge gas supplied through the sub-supply port 12. As shown in the second embodiment, if the supply port 6 is formed such that the ambient flow 19 and purge gas flow 8 are just opposite to each other, the inside of the cover 9 can be stably purged. If the sub-supply port 12 is formed in the lower end of the cover 9 in the vicinity of the supply port 6, the inside of the cover 9 can be more stably purged.

Figure 8A:
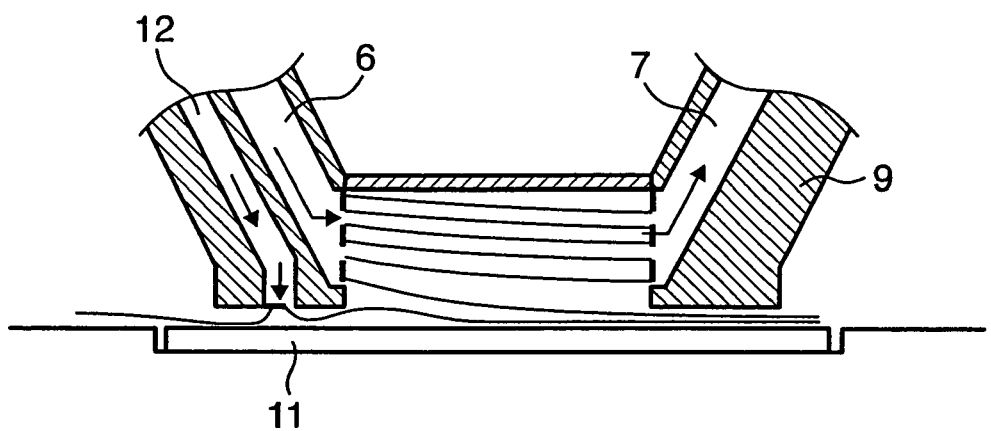
FIG. 8A is a stream diagram showing the flow of purge gas in the vicinity of a wafer in a projection exposure apparatus according to the fourth embodiment.
Figure 8B:
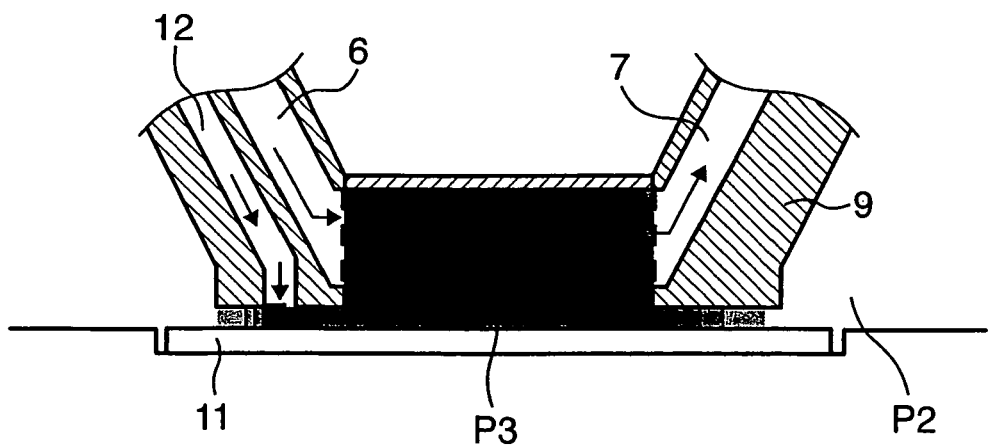
FIG. 8B is a diagram showing the pressure distribution of the purge gas in the vicinity of the wafer in the projection exposure apparatus according to the fourth embodiment.

The purge gas flow inside the cover 9 and the pressure distribution according to the fourth embodiment, which produce the above effect, will be described. FIG. 8A is a stream diagram of the purge gas at the center of the inside of the cover 9 when the sub-supply port 12 is formed in the lower end of the cover 9 in the vicinity of the supply port 6, and FIG. 8B is a schematic contour diagram of the pressure distribution taken at the same location as that of FIG. 8A. In the schematic contour diagram of FIG. 8B, the darker the color, the higher the pressure; the lighter the color, the lower the pressure. When the sub-supply port 12 is formed in the lower end of the cover 9 in the vicinity of the supply port 6, the pressure inside the cover 9 cannot be increased so much as in a case wherein the sub-supply port 12 is formed to surround the periphery of the exposure area (third embodiment). As shown in FIGS. 8A and 8B, however, what enters the vicinity of the lower side of the supply port 6 is the purge gas supplied through the sub-supply port 12. Thus, the impurity concentration inside the cover 9 does not degrade. Since no whirl is generated in the vicinity of the lower side of the supply port 6, the pressure inside the cover 9 does not decrease. As a result, a pressure P3 inside the cover 9 becomes higher than a pressure P2 outside the cover 9, so that the inside of the cover 9 can be purged stably. While the pressure P3 inside the cover 9 may be slightly decreased, when the sub-supply port 12 is formed in the lower end of the cover 9 in the vicinity of the supply port 6, almost the same effect can be obtained with a smaller flow rate of the purge gas than that of a case wherein the sub-supply port 12 is formed to surround the periphery of the exposure area. Therefore, the operation cost of the exposure apparatus can be reduced.

As described above, the exposure apparatus according to the fourth embodiment is an exposure apparatus (FIG. 14) for irradiating a photosensitive substrate placed on a wafer stage with exposure light through a projection optical system, and comprises a cover (9) which extends from the wafer-side end of the projection optical system (5) toward the vicinity of the wafer stage (10) to surround an exposure optical path, a first supply port (6) through which purge gas formed of inert gas blows out toward the inside of the cover (9), a second supply port (12) which is formed in the lower portion of the cover (9) and through which the purge gas blows out toward the wafer stage (10), and a first recovery port (7) through which the purge gas supplied through the first and second supply ports (6 and 12) is drawn by suction. The second supply port is formed in the vicinity of the first supply port.

Figure 3A:
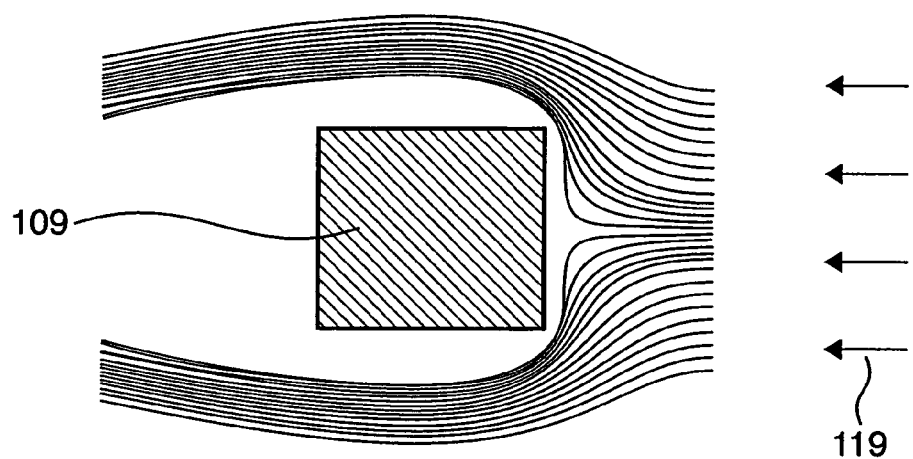
FIG. 3A is a stream diagram of the inert gas in the vicinity of the cover when the inert gas is supplied to flow outside the cover.
Figure 3B:
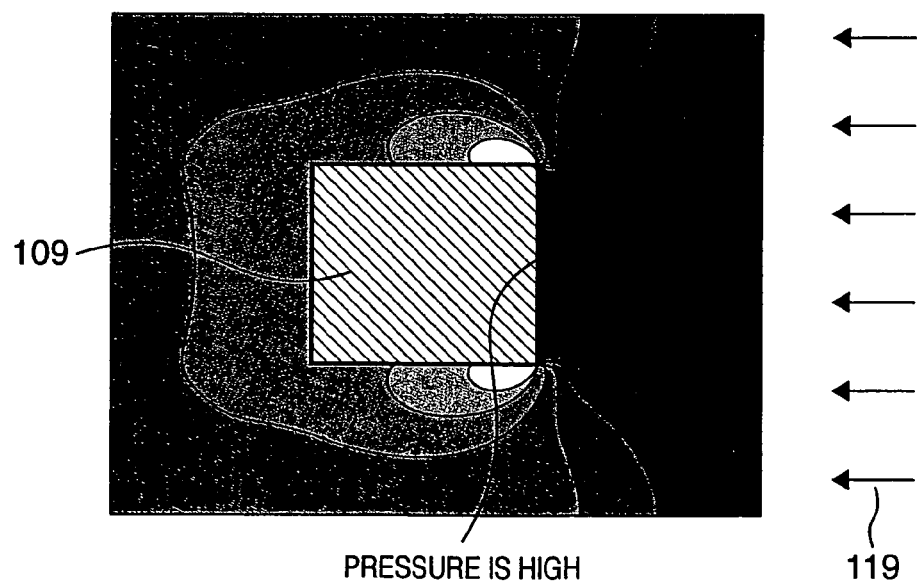
FIG. 3B is a pressure distribution diagram of the inert gas in the vicinity of the cover when the inert gas is supplied to flow outside the cover.
Figure 4A:
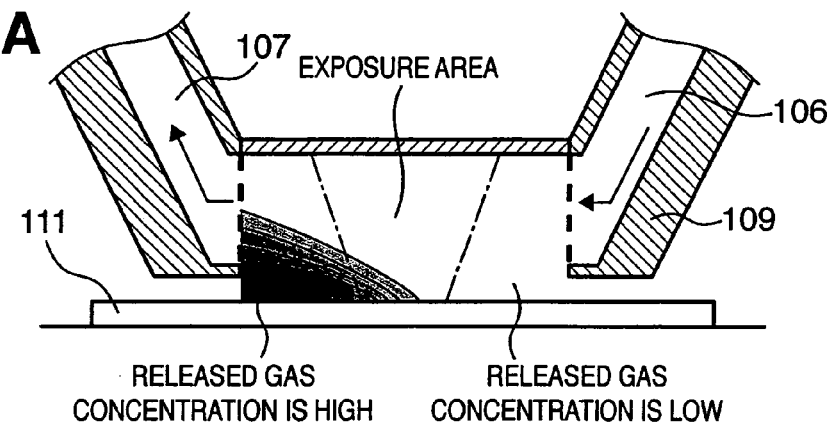
FIGS. 4A and 4B are diagrams showing the concentration distribution of released gas which is formed inside the cover when a general purging scheme is used.
Figure 4B:
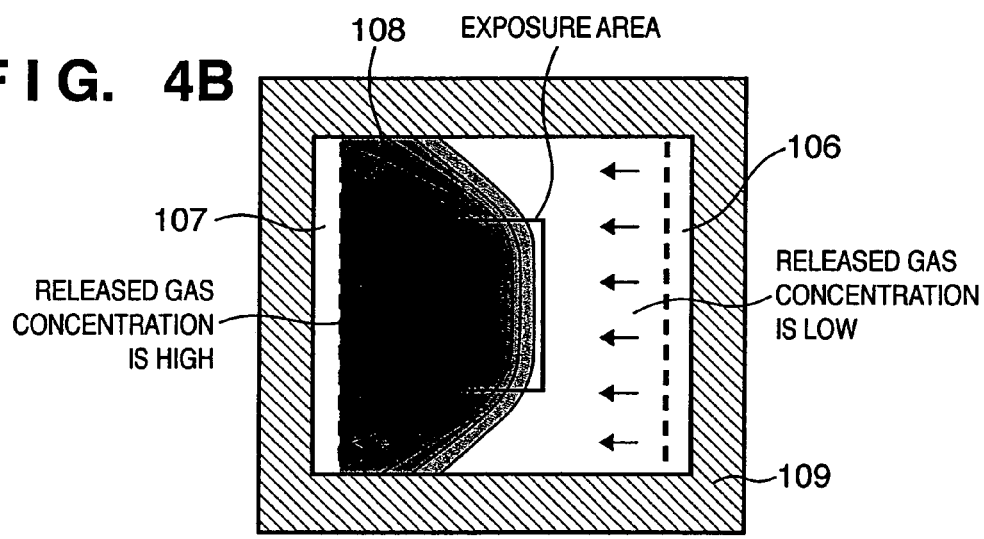
Figure 4C:
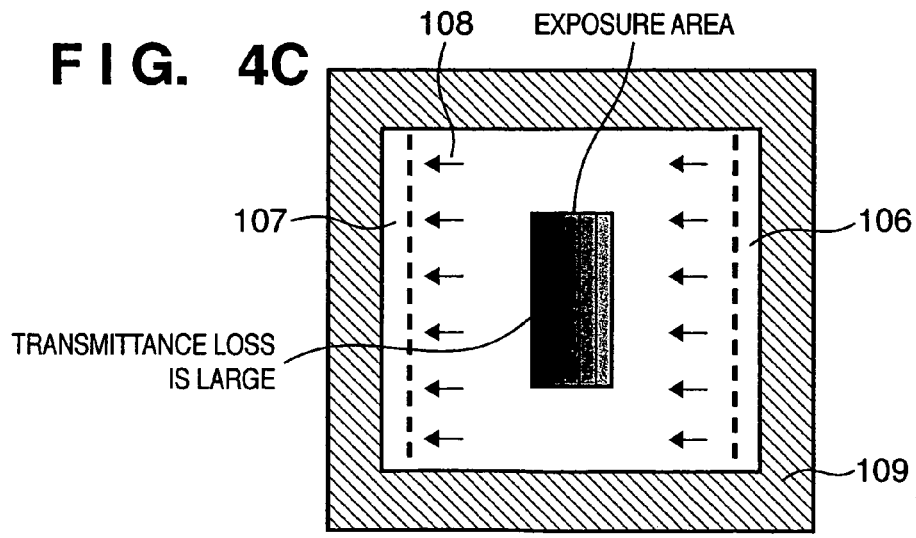
FIG. 4C is a distribution diagram of a transmittance loss caused by the concentration distribution of the released gas which is formed inside the cover when the general purging scheme is used.

According to the above arrangement, part of the purge gas supplied through the second supply port (12) flows to inside the cover (9) to prevent a whirl from being generated in the vicinity of the lower side of the first supply port (6), while the remaining purge gas flows out to the periphery of the cover (9) through a gap between the cover (9) and a wafer (11). At this time, as shown in FIG. 8B, the pressure does not decrease in the vicinity of the lower side of the supply port (6). The pressure P3 inside the cover (9) becomes uniform, and can be set higher than the outer pressure P2. Even if a pressure distribution as shown in FIG. 3B is formed around the cover 9 due to the influence of the ambient flow 19, the inside of the cover 9 can be purged stably without being adversely affected by the pressure distribution.

In the exposure apparatus of the fourth embodiment, the supply port 6 is formed such that the ambient flow 19 and the purge gas flow 8 are just opposite to each other. Depending on the positions of the respective types of units that constitute the exposure apparatus, sometimes the supply port 6 cannot be formed such that the ambient flow 19 and the purge gas flow 8 are just opposite to each other. Even in this case, if the sub-supply port 12 is formed in the lower end of the cover 9 in the vicinity of the supply port 6, the pressure inside the cover 9 becomes uniform, and the inside of the cover 9 can be purged without being adversely affected by the ambient flow 19. Thus, the inside of the cover 9 can be purged stably.

(Fifth Embodiment)

In the fourth embodiment, the sub-supply port 12 is formed in the lower end of the cover 9 in the vicinity of the supply port 6. In the fifth embodiment, sub-supply ports 12 are formed on the front and rear sides of the exposure area to be parallel to the scanning direction of exposure. In other words, the fifth embodiment is obtained through modification of the fourth embodiment by forming another sub-supply port 12 in the lower end of the cover 9 in the vicinity of the first recovery port 7.

Figure 15A:
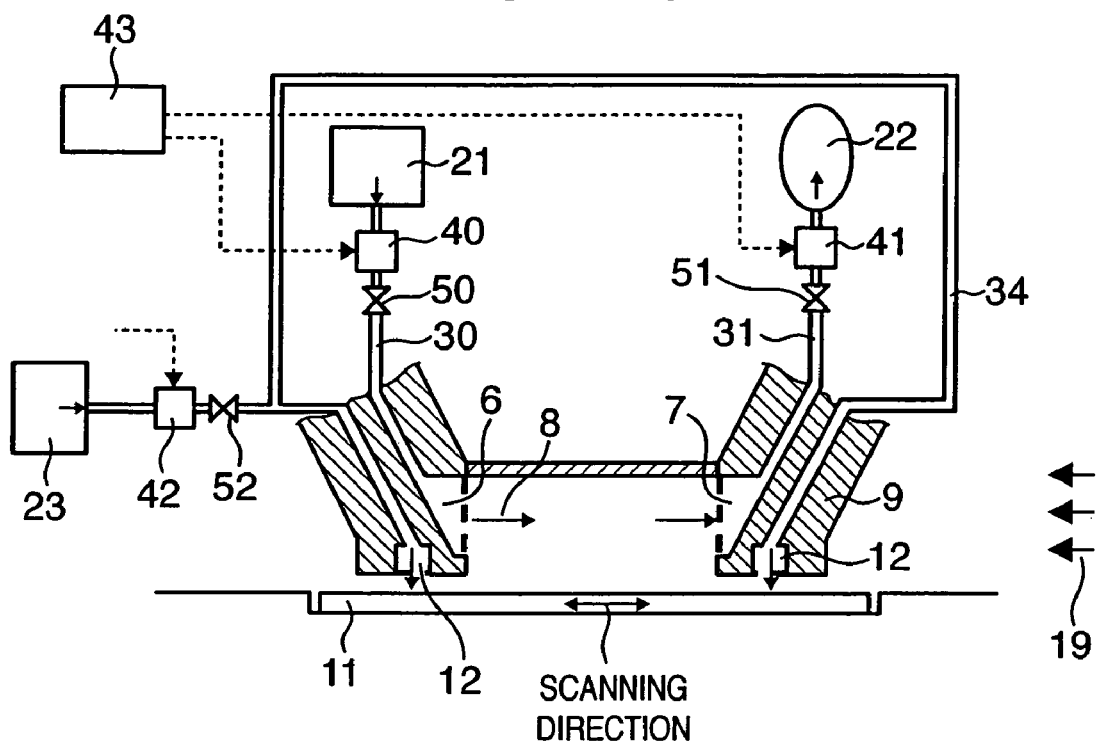
FIGS. 15A and 15B are diagrams for explaining the schematic arrangement of the vicinity of a wafer in a projection exposure apparatus according to the fifth embodiment.
Figure 15B:
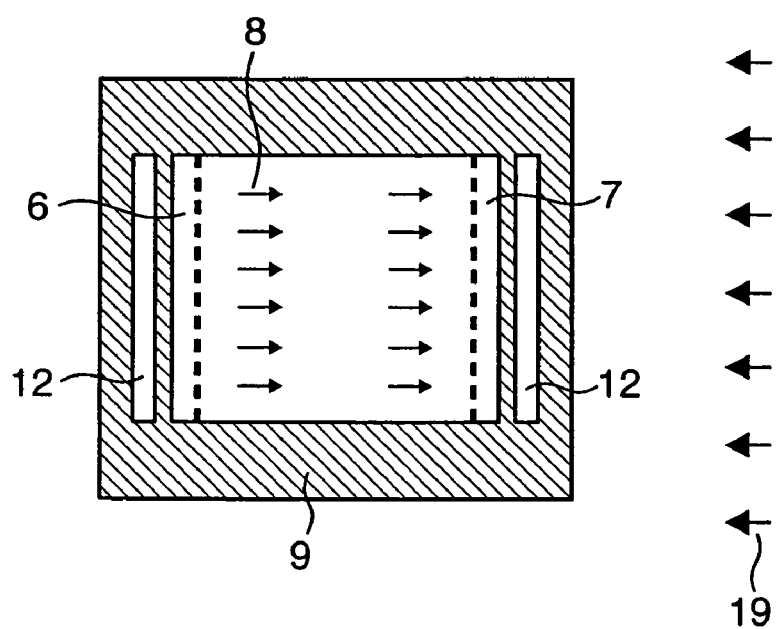

FIGS. 15A and 15B are diagrams for explaining the arrangement of an exposure apparatus according to the fifth embodiment. A supply port 6 and recovery port 7 are formed inside a cover 9. Also, sub-supply ports 12 are formed in the lower end of the cover 9 in the vicinities of the supply port 6 and recovery port 7. Except that another sub-supply port 12 is formed in the lower end of the cover 9 in the vicinity of the recovery port 7, the fifth embodiment is the same as the fourth embodiment. Hence, FIGS. 15A and 15B show the arrangement of the main port of only the vicinity of a wafer. In FIG. 15A, as a sectional view, and FIG. 15B, as a plan view, the same reference numerals as those in FIG. 14 denote the same constituent elements. The flow rate control and a purging method inside the cover 9 of the fifth embodiment are shown in FIGS. 1 to 4, and a description thereof will be omitted.

Figure 16A:
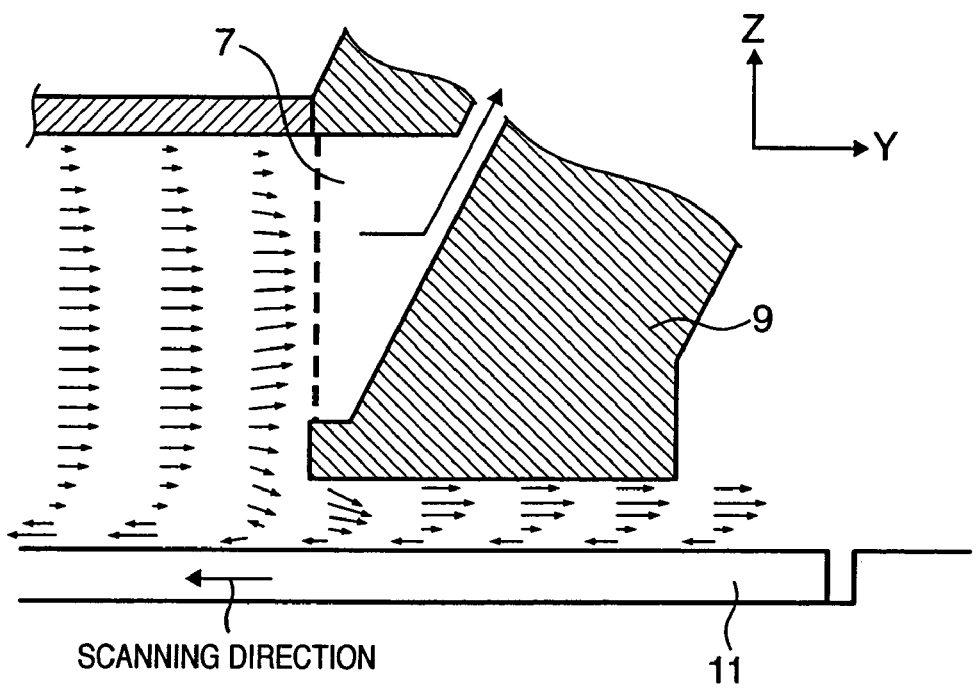
FIG. 16A is a diagram showing the flow of gas in the vicinity of the cover during scanning.
Figure 16B:
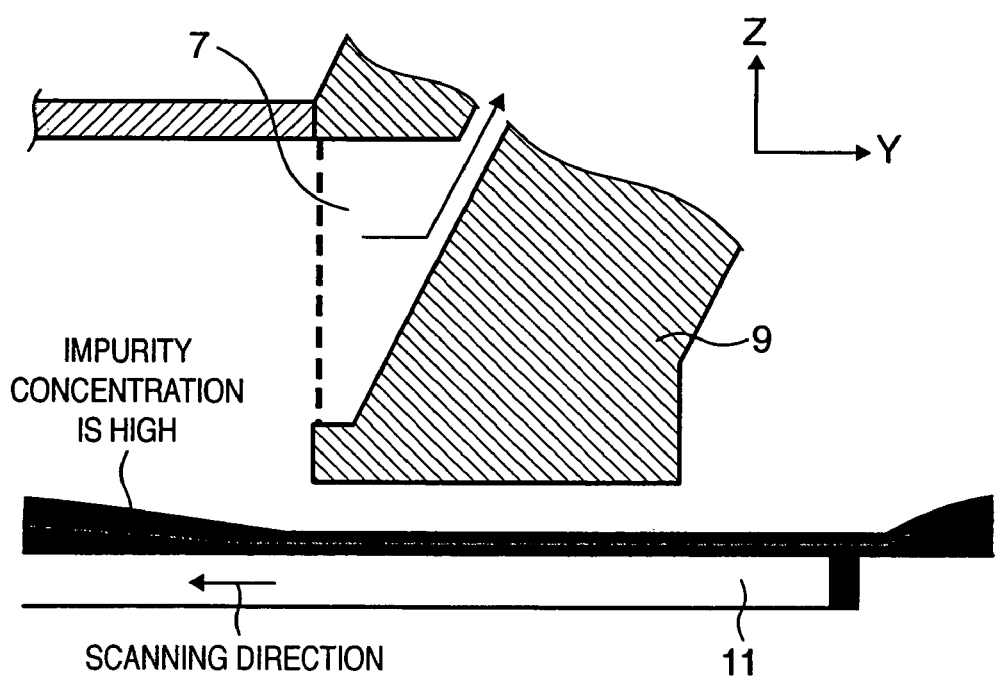
FIG. 16B is a diagram showing the impurity concentration distribution in the vicinity of the cover during scanning.

The effect obtained when the sub-supply ports 12 are formed on the front and rear sides of the exposure area to be parallel to the scanning direction will be described with reference to FIGS. 16A and 16B and FIGS. 17A and 17B. FIG. 16A is an enlarged view of the vicinity of the cover 9 having a recovery port 7 in a case wherein the cover 9 has no sub-supply port 12, and is a schematic diagram showing the flow during scanning. In FIG. 16A, scanning is performed in the direction from the positive side to the negative side along the Y-axis. FIG. 16B is a schematic contour diagram of the impurity concentration distribution taken at the same location as that of FIG. 16A. In the schematic contour diagram of FIG. 16B, the darker the color, the higher the impurity concentration; the lighter the color, the lower the impurity concentration. As shown in FIG. 16A, during scanning, a flow directed from the outside to the inside of the cover 9 is formed on the surface of the wafer. Due to this flow, if no sub-supply port 12 is formed, impurities enter from the outside of the cover 9 along the flow on the surface of the wafer, as shown in FIG. 16B, and the impurity concentration inside the cover 9 degrades.

Figure 17A:
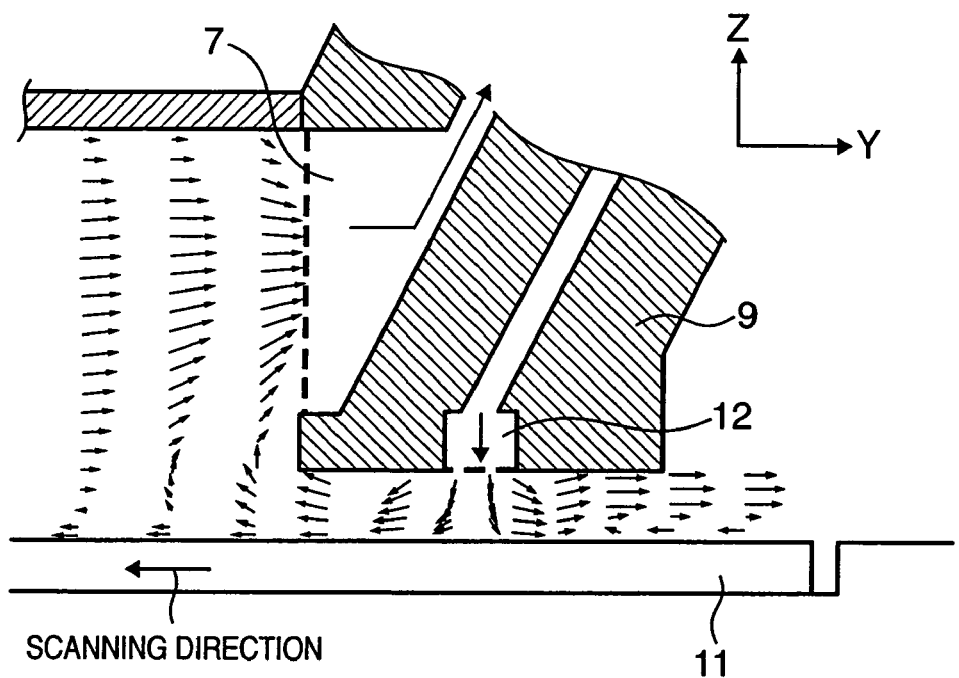
FIG. 17A is a diagram showing the flow of purge gas in the vicinity of the wafer in the projection exposure apparatus according to the fifth embodiment.
Figure 17B:
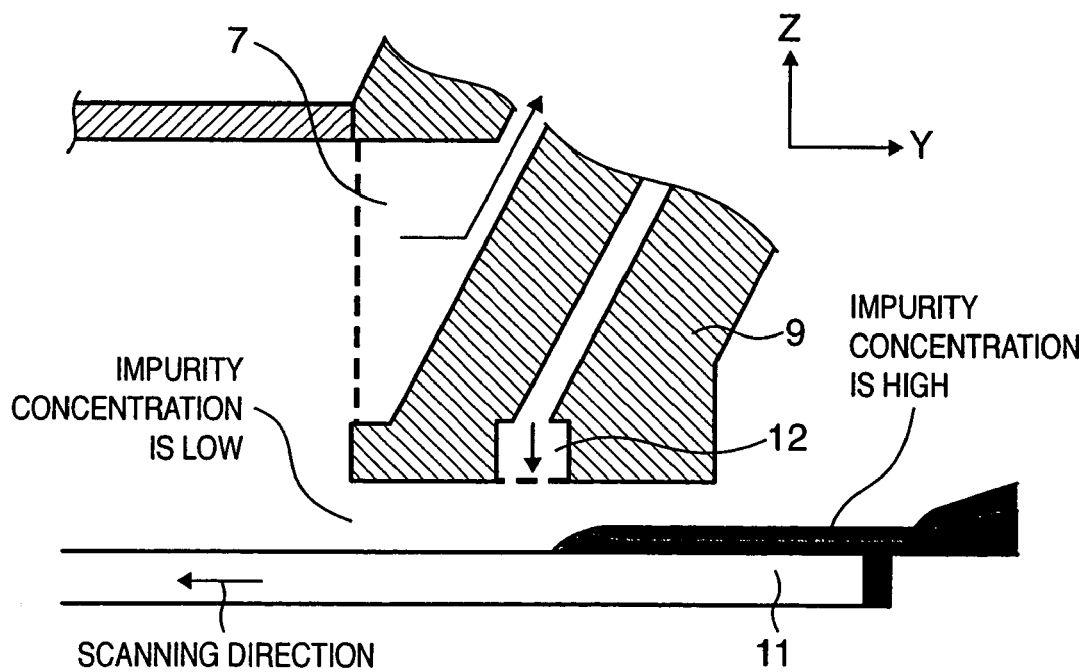
FIG. 17B is a diagram showing the impurity concentration distribution in the vicinity of the wafer in the projection exposure apparatus according to the fifth embodiment.

If a sub-supply port 12 is formed (FIG. 17A), the purge gas supplied through the sub-supply port 12 collides against the surface of the wafer and changes its route, so that external gas can be prevented from entering. Therefore, as shown in FIG. 17B, impurities do not enter from the outside of the cover 9, and the inside of the cover 9 can be purged stably.

FIGS. 16A and 16B and FIGS. 17A and 17B show the flow in the vicinity of the cover 9 having the recovery port 7 in cases where scanning is performed in the direction from the positive side to the negative side along the Y-axis. When scanning is performed in the direction from the negative side to the positive side along the Y-axis, the same flow occurs in the vicinity of the cover 9 having the supply port 6. Therefore, if another sub-supply port 12 is formed in the lower end of the cover 9 in the vicinity of the supply port 6, impurities outside the cover 9 can be effectively prevented from entering during scanning, so that the inside of the cover 9 can be purged stably.

As described above, the exposure apparatus according to the fifth embodiment is an exposure apparatus (FIGS. 15A and 15B) for irradiating a photosensitive substrate placed on a wafer stage with exposure light through a projection optical system, and comprises a cover (9) which extends from the wafer-side end of the projection optical system (5) toward the vicinity of the wafer stage (10) to surround an exposure optical path, a first supply port (6) through which purge gas formed of inert gas blows out toward the inside of the cover (9), second supply ports (12) which are formed in the lower portion of the cover (9) and through which the purge gas blows out toward the wafer stage (10), and a first recovery port (7) through which the purge gas supplied through the first and second supply ports (6 and 12) is drawn by suction. The second supply ports are formed in the vicinities of the first supply port and first recovery port.

According to the above arrangement, the purge gas supplied through the second supply port (12) collides against the surface of the wafer (11) and changes its route. During scanning, even if a flow directed from the outside to the inside of the cover (9) is formed on the surface of the wafer (11), impurities outside the cover (9) can be prevented from entering, as shown in FIG. 17A. Therefore, the inside of the cover 9 can be purged stably.

In the exposure apparatus of the fifth embodiment, the supply port 6 and recovery port 7 are formed such that a purge gas flow 8 and the scanning direction of exposure are parallel to each other. Depending on the positions of the respective types of units that constitute the exposure apparatus, sometimes the supply port 6 and recovery port 7 cannot be formed such that the purge gas flow 8 and the scanning direction of exposure are parallel to each other. In this case, obviously, one sub-supply port 12 may be formed in the lower end of the cover 9 in the vicinity of the supply port 6, so that the sub-supply ports 12 are formed on the front and rear sides of the exposure area to be parallel to the scanning direction of exposure.

Except for scanning during exposure, sometimes the wafer may move perpendicularly to the scanning direction. In this case, to purge the inside of the cover 9 stably, in addition to the arrangement of the fifth embodiment, sub-supply ports 12 may obviously be formed on the front and rear sides of the exposure area to be perpendicular to the scanning direction of exposure.

(Sixth Embodiment)

In the fourth embodiment, the sub-supply port 12 is formed in the lower end of the cover 9 in the vicinity of the supply port 6. In the sixth embodiment, as shown in FIG. 18, in place of the sub-supply port 12, a sub-recovery port 25 is formed in the lower end of a cover 9 in the vicinity of a supply port 6.

FIG. 18 is a diagram for explaining the arrangement of an exposure apparatus according to the sixth embodiment. The supply port 6 and a recovery port 7 are formed inside the cover 9, and the sub-recovery port 25 is formed in the lower end of the cover 9 in the vicinity of the supply port 6. Purge gas and gas outside the cover 9 are recovered from the direction of a wafer 11 through the sub-recovery port 25. Except that the sub-recovery port 25 is formed in place of the sub-supply port 12, the sixth embodiment is the same as the fourth embodiment. Thus, FIG. 18 shows the arrangement of the main part of only the vicinity of the wafer. In FIG. 18, the same reference numerals as in FIG. 14 denote the same constituent elements. The flow control of the sixth embodiment is described in the first to fourth embodiments, and a description thereof will accordingly be omitted.

In the sixth embodiment, a vacuum pump 24 for recovering the purge gas is connected to the sub-recovery port 25 through a pipe 35. A flow controller 45 is provided between the sub-recovery port 25 and vacuum pump 24. The flow controller 45 recovers the purge gas and the gas outside the cover 9 through the sub-recovery port 25 at a flow rate in accordance with control information from a main control system 43. The flow controller 45 opens and closes a valve 53 at predetermined timings on the basis of the control information from the main control system 43. The sub-recovery port 25 uses a porous plate or porous material so that the flow in the vicinity of the sub-recovery port 25 is straightened.

In the exposure apparatus according to the sixth embodiment, assume that the inside of the cover 9 is to be purged. First, control information is transmitted from the main control system 43 to a flow controller 40 to open a valve 50. The purge gas is supplied at a predetermined flow rate through the supply port 6. After that, control information is transmitted from the main control system 43 to a flow controller 41 and the flow controller 45 to open a valve 51 and the valve 53, respectively. The purge gas is recovered at a predetermined flow rate through the recovery port 7. The purge gas and the gas outside the cover 9 are recovered at a predetermined flow rate through the sub-recovery port 25.

At this time, the control information is transmitted from the main control system 43 to the flow controllers 41 and 45 such that the total flow rate of the purge gas recovered through the recovery port 7 and sub-recovery port 25 is smaller than the flow rate of the purge gas supplied through the supply port 6. Hence, part of the purge gas supplied through the supply port 6 flows out from the inside of the cover 9 to the outside of the cover 9. The pressure inside the cover 9 becomes higher than the pressure outside the cover 9, so that the inside of the cover 9 can be purged stably.

Figure 19A:
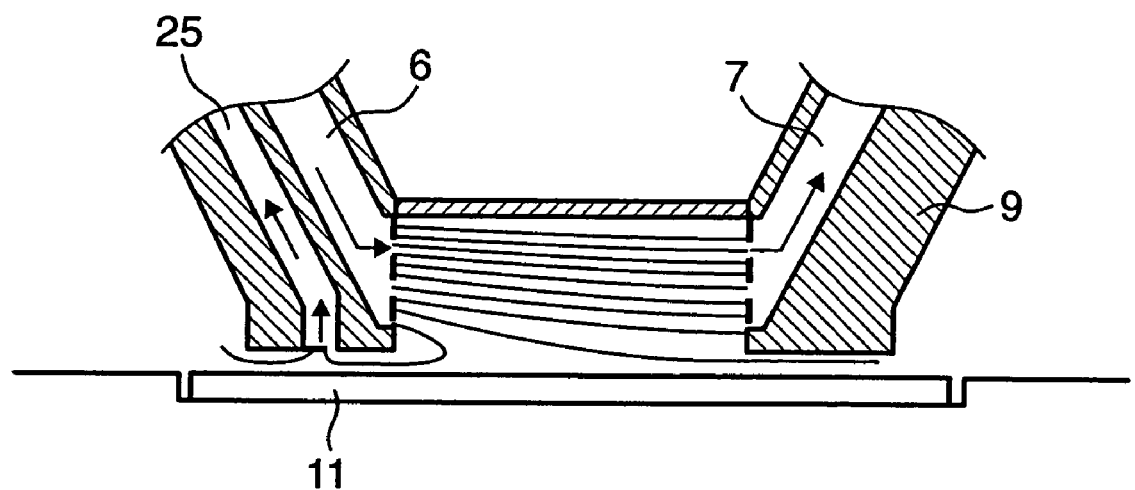
FIG. 19A is a stream diagram showing the flow of purge gas in the vicinity of the wafer in the projection exposure apparatus according to the sixth embodiment.
Figure 19B:
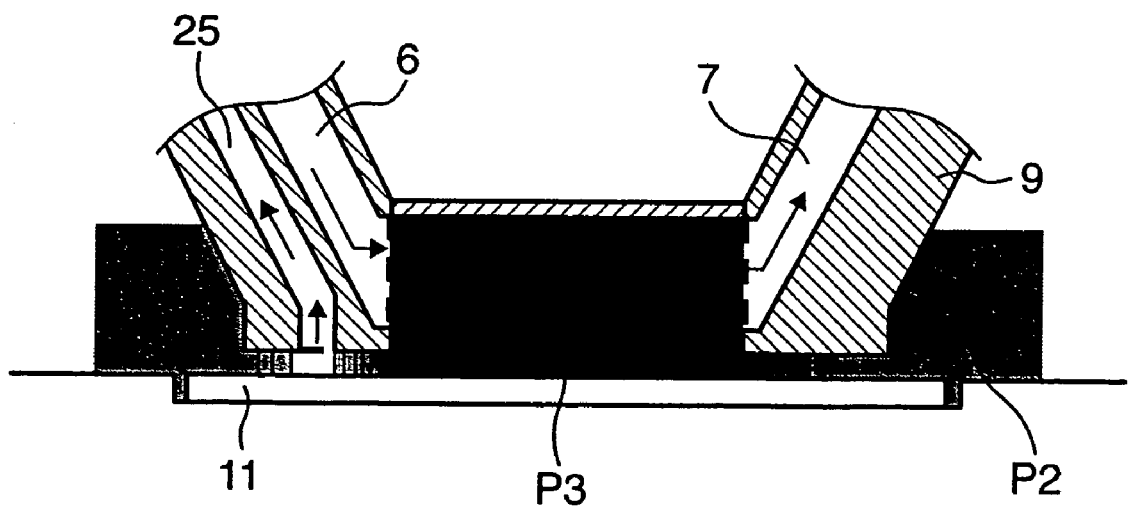
FIG. 19B is a diagram showing the pressure distribution of the purge gas in the vicinity of the wafer in the projection exposure apparatus according to the sixth embodiment.

The purge gas flow inside the cover 9 and the pressure distribution according to the sixth embodiment, which produce the above effect, will be described. FIG. 19A is a stream diagram of the purge gas at the center of the inside of the cover 9 when the sub-recovery port 25 is formed in the lower end of the cover 9 in the vicinity of the supply port 6, and FIG. 19B is a schematic contour diagram of the pressure distribution taken at the same location as that of FIG. 19A. In the schematic contour diagram of FIG. 19B, the darker the color, the higher the pressure; the lighter the color, the lower the pressure. As shown in FIGS. 19A and 19B, when the sub-recovery port 25 is formed in the lower end of the cover 9 in the vicinity of the supply port 6, a flow directed from the inside of the cover 9 toward the sub-recovery port 25 is formed. Part of the purge gas supplied through the supply port 6 flows into the gap between the cover 9 and wafer 11. No whirl is accordingly generated in the vicinity of the lower side of the supply port 6, and the pressure inside the cover 9 does not decrease. At this time, the pressure becomes the lowest in the vicinity of the lower side of the sub-recovery port 25, so that the pressure outside the cover 9 can be prevented from adversely affecting the inside of the cover 9. As a result, a pressure P3 inside the cover 9 becomes higher than a pressure P2 outside the cover 9, so that the inside of the cover 9 can be purged stably.

As described above, the exposure apparatus according to the sixth embodiment is an exposure apparatus (FIG. 18) for irradiating a photosensitive substrate arranged on a wafer stage with exposure light through a projection optical system, and comprises a cover (9) which extends from the wafer-side end of the projection optical system (5) toward the vicinity of the wafer stage (10) to surround an exposure optical path, a first supply port (6) through which purge gas formed of inert gas blows out toward the inside of the cover (9), a first recovery port (7) through which the purge gas supplied through the first supply port (6) is drawn by suction, and a second recovery port (25) which is formed in the lower portion of the cover (9) and through which the purge gas supplied through the first supply port (6) in a direction from the wafer (11) and gas outside the cover 9 are to be drawn by suction. The second recovery port is formed in the vicinity of the first supply port.

According to the above arrangement, the purge gas supplied through the first supply port (6) forms a flow toward the second recovery port (25), to prevent a whirl from being generated in the vicinity of the lower side of the supply port (6). At this time, as shown in FIG. 19B, the pressure does not decrease in the vicinity of the lower side of the first supply port (6). The pressure P3 inside the cover (9) is made uniform and can be set to be higher than the outer pressure P2, so that the inside of the cover 9 can be stably purged.

(Seventh Embodiment)

In the sixth embodiment, the sub-recovery port 25 is formed in the lower end of the cover 9 in the vicinity of the supply port 6. In the seventh embodiment, sub-recovery ports 25 are formed on the front and rear sides of the exposure area to be parallel to the scanning direction of exposure. In other words, the seventh embodiment is obtained through modification of the sixth embodiment by forming another sub-recovery port 25 in the lower end of a cover 9 in the vicinity of the recovery port 7.

Figure 20A:
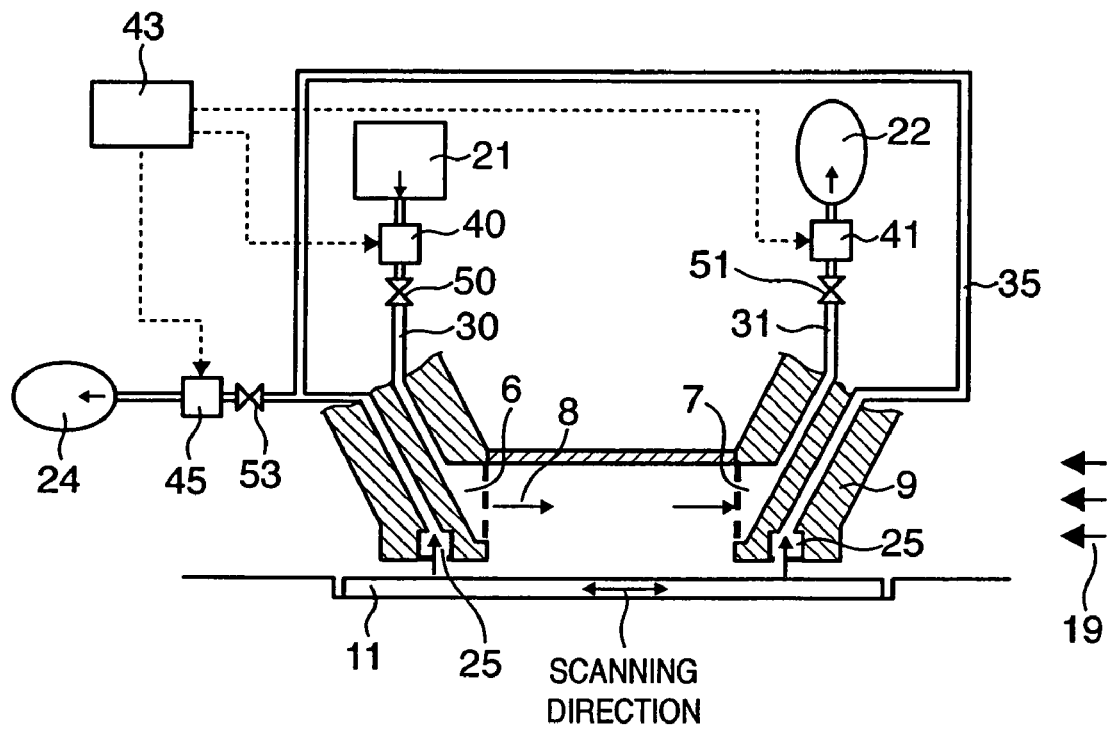
FIGS. 20A and 20B are diagrams showing the schematic arrangement of the vicinity of a wafer in a projection exposure apparatus according to the seventh embodiment.
Figure 20B:
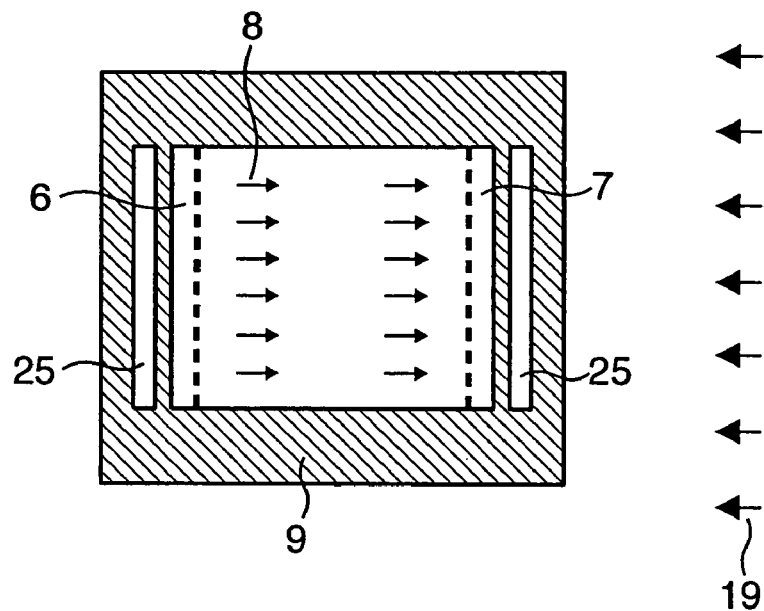

FIGS. 20A and 20B are diagrams for explaining the arrangement of an exposure apparatus according to the seventh embodiment. A supply port 6 and recovery port 7 are formed inside a cover 9, and the sub-recovery ports 25 are formed in the lower end of the cover 9 in the vicinities of the supply port 6 and recovery port 7. Except that the sub-recovery port 25 is formed in the lower end of the cover 9 in the vicinity of the recovery port 7, the seventh embodiment is the same as the sixth embodiment. Thus, FIGS. 20A and 20B show the arrangement of the main part of only the vicinity of the wafer. In FIG. 20A as a sectional view and FIG. 20B as a plan view, the same reference numerals as in FIG. 18 denote the same constituent elements. The flow control and a purging method inside the cover 9 are described in the first to sixth embodiments, and a description thereof will accordingly be omitted.

Figure 21A:
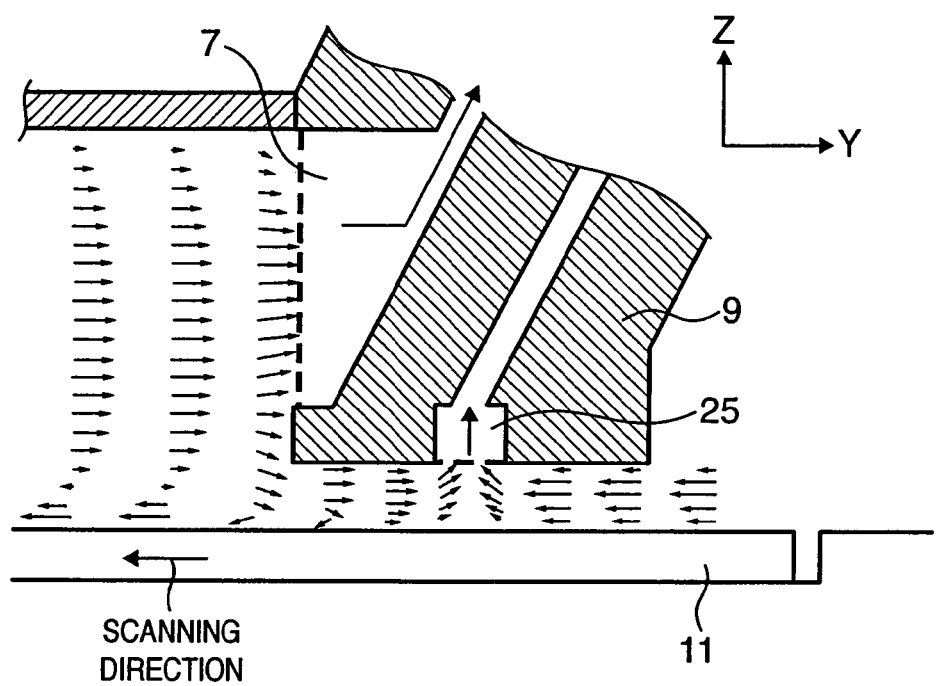
FIG. 21A is a diagram showing the flow of purge gas in the vicinity of the wafer in the projection exposure apparatus according to the seventh embodiment.
Figure 21B:
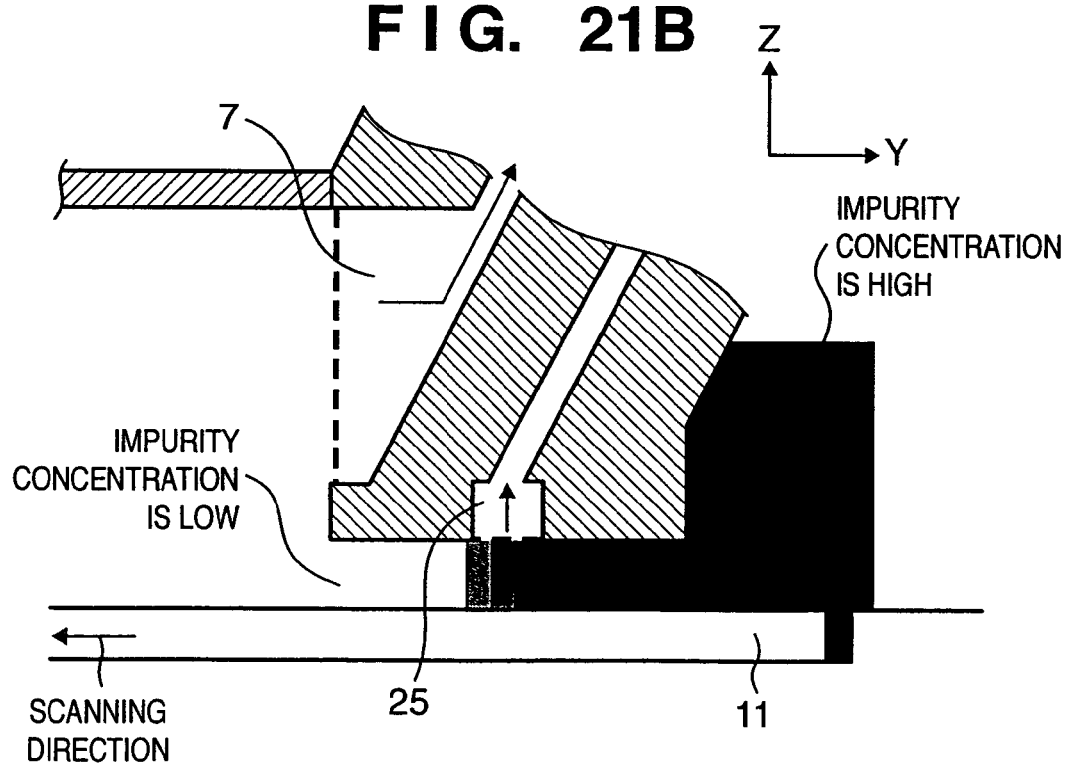
FIG. 21B is a diagram showing the impurity concentration distribution in the vicinity of the wafer in the projection exposure apparatus according to the seventh embodiment.

The effect obtained when the sub-recovery ports 25 are formed on the front and rear sides of the exposure area to be parallel to the scanning direction will be described with reference to FIGS. 21A and 21B. FIG. 21A is an enlarged diagram of the vicinity of the cover 9 having the recovery port 7 in a case wherein the sub-recovery ports 25 are formed, and is a schematic diagram of the flow during scanning. In FIG. 21A, scanning is performed in the direction from the positive side to the negative side along the Y-axis. FIG. 21B is a schematic contour diagram of the impurity concentration taken at the same location as that of FIG. 21A. In the schematic contour diagram of FIG. 21B, the darker the color, the higher the impurity concentration; the lighter the color, the lower the impurity concentration. As shown in FIG. 21A, even if a flow directed from the periphery of the cover 9 toward the inside of the cover 9 is formed due to the flow on the surface of the wafer, since the sub-recovery port 25 is formed, the impurities can be recovered. Therefore, the impurities do not enter from outside of the cover 9, as shown in FIG. 21B, and the inside of the cover 9 can be stably purged.

FIGS. 21A and 21B show the flow in the vicinity of the cover 9 having the recovery port 7 in a case wherein scanning is performed in the direction from the positive side to the negative side along the Y-axis. When scanning is performed in the direction from the negative side to the positive side along the Y-axis, the same flow occurs in the vicinity of the cover 9 having the supply port 6. Therefore, if another sub-recovery port 25 is formed in the lower end of the cover 9 in the vicinity of the supply port 6, impurities outside the cover 9 can be prevented from entering during scanning, so that the inside of the cover 9 can be purged stably.

As described above, the exposure apparatus according to the seventh embodiment is an exposure apparatus (FIGS. 20A and 20B) for irradiating a photosensitive substrate placed on a wafer stage with exposure light through a projection optical system, and comprises a cover (9) which extends from the wafer-side end of the projection optical system (5) toward the vicinity of the wafer stage (10) to surround an exposure optical path, a first supply port (6) through which purge gas formed of inert gas blows out toward the inside of the cover (9), a first recovery port (7) through which the purge gas supplied through the first supply port (6) is drawn by suction, and second recovery ports (25) which are formed in the lower portion of the cover (9) and through which the purge gas supplied through the first supply port (6) in a direction from the wafer (11) and gas outside the cover 9 are to be drawn by suction. The second recovery ports are formed in the vicinities of the first supply port and first recovery port.

According to the above arrangement, during scanning, even if a flow directed from the outside to the inside of the cover (9) is formed on the surface of the wafer (11), impurities entering from the outside of the cover (9) can be recovered through the sub-recovery ports (25), as shown in FIG. 21A. Therefore, the inside of the cover (9) can be purged stably.

In the exposure apparatus according to the seventh embodiment, the supply port 6 and recovery port 7 are formed such that a purge gas flow 8 and the scanning direction of exposure are parallel to each other. Depending on the positions of the respective types of units that constitute the exposure apparatus, sometimes the supply port 6 and recovery port 7 cannot be formed such that the purge gas flow 8 and the scanning direction of exposure are parallel to each other. In this case, obviously, another sub-recovery port 25 may be formed in the lower end of the cover 9 in the vicinity of the supply port 6, so that the sub-recovery ports 25 are formed on the front and rear sides of the exposure area to be parallel to the scanning direction of exposure.

Except for scanning during exposure, sometimes the wafer may move in a direction perpendicular to the scanning direction. In this case, to purge the inside of the cover 9 stably, in addition to the arrangement of the seventh embodiment, the sub-recovery ports 25 may obviously be formed on the front and rear sides of the exposure area to be perpendicular to the scanning direction of exposure.

(Eighth Embodiment)

FIG. 22 is a diagram showing the main part of an exposure apparatus according to the eighth embodiment. This exposure apparatus has an arrangement similar to that of the exposure apparatus shown in the first embodiment, except that a straightening plate 20 is disposed in part of a supply port 6. Except for this, the arrangement of the eighth embodiment is the same as that of the first embodiment. Therefore, FIG. 22 shows the arrangement of the main part of only the vicinity of the wafer.

Figure 9A:
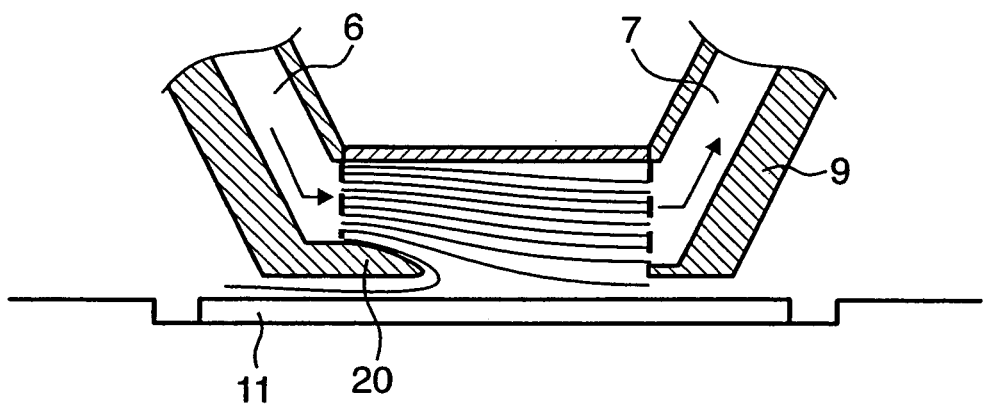
FIG. 9A is a stream diagram showing the flow of purge gas in the vicinity of a wafer in a projection exposure apparatus according to the eighth embodiment.
Figure 9B:
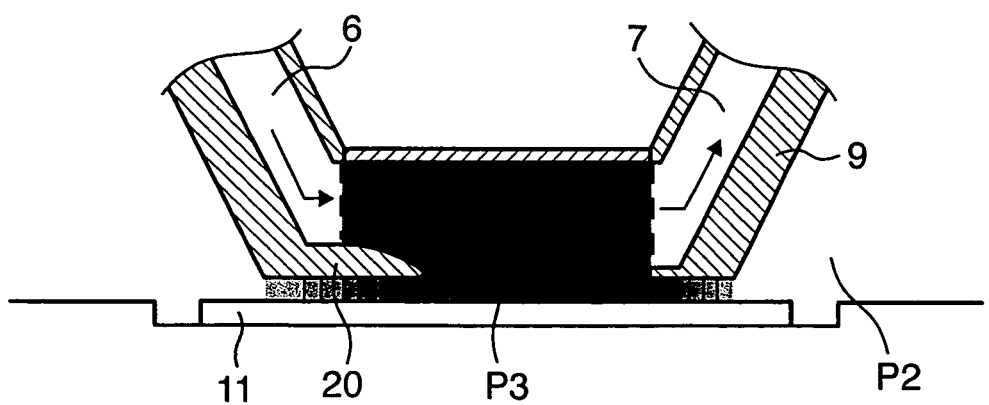
FIG. 9B is a diagram showing the pressure distribution of the purge gas in the vicinity of the wafer in the projection exposure apparatus according to the eighth embodiment.

The straightening plate 20 is a plate-like or solid member that forms a smooth streamline from the supply port 6 toward a wafer 11, and is obtained by molding a material such as a metal, resin, or ceramic material. Part of the purge gas supplied through the supply port 6 is guided by the straightening plate 20 and flows out to the periphery of the cover 9 through the gap between a cover 9 and the wafer 11. Because of the presence of the straightening plate 20, no whirl is generated in the vicinity of the lower side of the supply port 6, as shown in FIGS. 9A and 9B. Thus, the pressure does not decrease in the vicinity of the lower side of the supply port 6, and the pressure inside the cover 9 becomes uniform, so that the inside of the cover 9 can be purged stably.

FIG. 9A is a stream diagram of the purge gas in the central section of the inside of the cover 9 in a case wherein the straightening plate 20 is disposed in part of the supply port 6, and FIG. 9B is a schematic contour diagram of the pressure distribution taken at the same location as that of FIG. 9A. In the schematic contour diagram of FIG. 9B, the darker the color, the higher the pressure; the lighter the color, the lower the pressure. As shown in FIG. 9A, when the straightening plate 20 is provided, part of the purge gas supplied through the supply port 6 is guided by the straightening plate 20 and flows out to the outside of the cover 9 through the gap between the cover 9 and wafer 11. Thus, no whirl is generated in the vicinity of the lower side of the supply port 6. At this time, as shown in FIG. 9B, the pressure does not decrease in the vicinity of the lower side of the supply port 6, and a pressure P3 inside the cover 9 becomes higher than a pressure P2 outside the cover 9, so that the inside of the cover 9 can be purged stably. Furthermore, to prevent the flow of the purge gas supplied through the supply port 6 from forming a turbulent flow and to guide it to the outside of the cover 9 quickly, at least part of a surface that forms the straightening plate 20 desirably forms a curved surface or streamline, as shown in FIGS. 9A and 9B.

As described above, in the exposure apparatus of the eighth embodiment, a straightening member (20) is provided at least in part of the first supply port (6), thus realizing stable purging. Preferably, at least part of a surface that forms the straightening member forms a curved surface or streamline.

According to the eighth embodiment, stable purging can be realized without requiring regulation of the flowing direction of the gas as shown in the second embodiment, or without using a sub-support port or sub-recovery port as shown in the third to seventh embodiments.

The straightening plate 20 shown in the eighth embodiment can obviously be applied to the exposure apparatuses described in the second to seventh embodiments or to an exposure apparatus to be described in the following ninth embodiment. Because of the presence of the straightening plate 20, the inside of the cover 9 can be purged more stably. For example, if a straightening plate 20 is disposed in the exposure apparatus shown in the second embodiment, no whirl is generated in the vicinity of the lower side of the supply port 6, and the pressure does not decrease, so that the pressure inside the cover 9 becomes uniform. Therefore, even if a pressure distribution is formed around the cover 9 due to the influence of an ambient flow 19, the inside of the cover 9 can be purged stably without being adversely affected by it.

(Ninth Embodiment)

Figure 23:
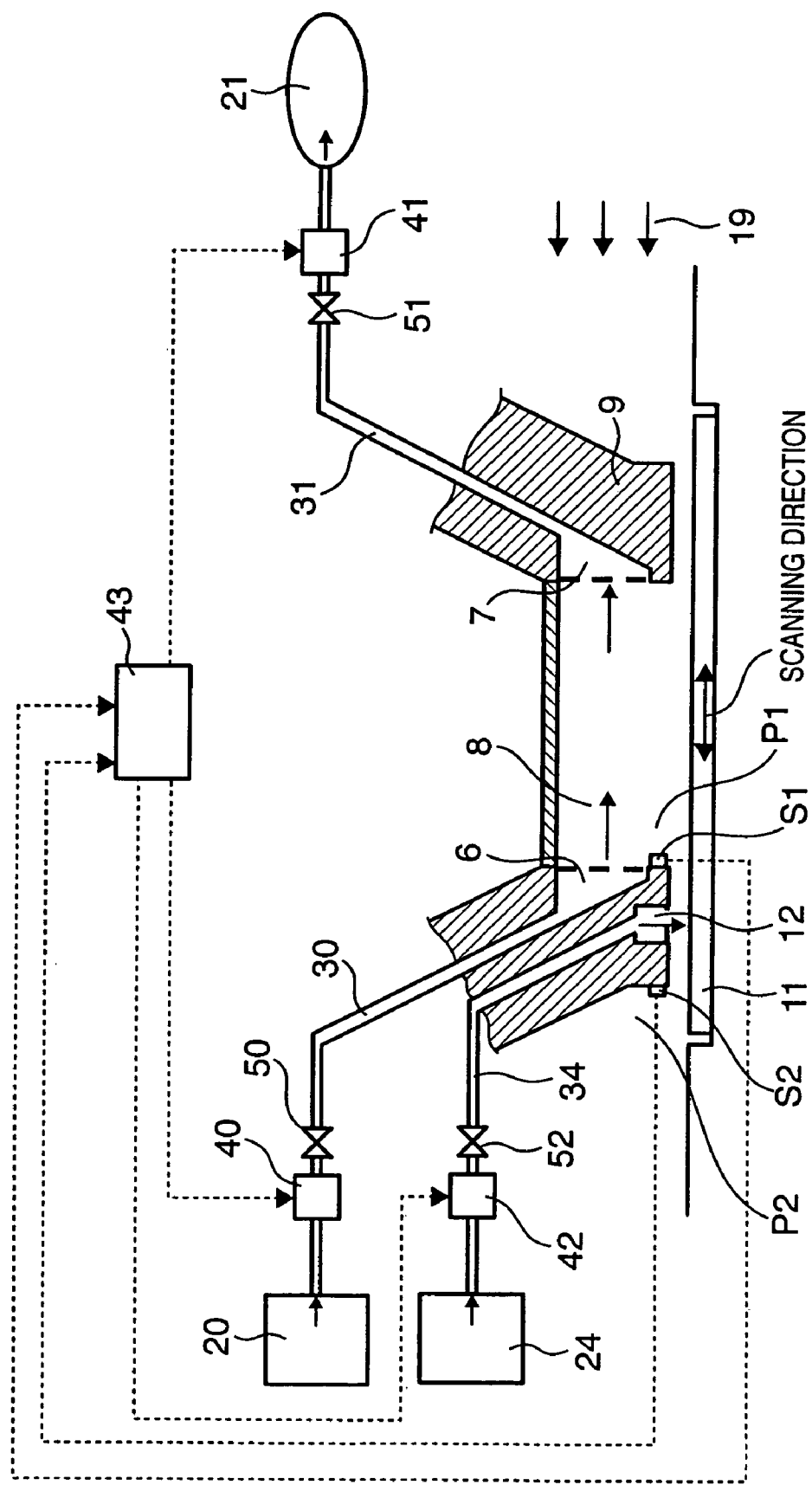
FIG. 23 is a diagram showing the schematic arrangement of the vicinity of a wafer in a projection exposure apparatus according to the ninth embodiment.

FIG. 23 is a diagram showing the main part of an exposure apparatus according to the ninth embodiment. The ninth embodiment is obtained through modification of the exposure apparatus shown in the fourth embodiment by disposing a pressure sensor S1 inside the cover 9, which measures the pressure inside the cover 9, and a pressure sensor S2 outside the cover 9, which measures the pressure outside the cover 9. A main control system 43 controls the flow rate of purge gas supplied through a supply port 6, the flow rate of purge gas recovered through a recovery port 7, and the flow rate of purge gas supplied through a sub-supply port 12, on the basis of the measurement results of the pressure sensors S1 and S2, such that the pressure inside the cover 9 becomes higher than the pressure outside the cover 9. Referring to FIG. 23, the pressure sensor S1 measures a pressure P1 in the vicinity of the lower side of the supply port 6, and the pressure sensor S2 measures a pressure P2 outside the cover 9. The measurement values are transmitted to the main control system 43. The main control system 43 transmits control information to flow controllers 40, 41, and 42, on the basis of the results measured by the pressure sensors S1 and S2, such that the pressure P1 in the vicinity of the lower side of the supply port 6 becomes higher than the pressure P2 outside the cover 9.

For example, as a transient pressure change caused by an abrupt atmospheric pressure fluctuation, if the pressure P2 outside the cover 9 becomes higher than the pressure P1 in the vicinity of the lower side of the supply port 6, the main control system 43 operates the flow controller 42 to increase the flow rate of the purge gas to be supplied through the sub-supply port 12. Accordingly, the pressure P1 in the vicinity of the lower side of the supply port 6 becomes higher than the pressure P2 outside the cover 9, so that the inside of the cover 9 can be purged stably. At this time, alternatively, the main control system 43 may operate the flow controllers 40 and 41 to increase the flow rate of the purge gas to be supplied through the supply port 6 and to decrease the flow rate of the purge gas to be recovered through the recovery port 7, so that the flow rate of the purge gas flowing out from the inside of the cover 9 to the periphery of the cover 9 increases. Then, the pressure inside the cover 9 increases, and the inside of the cover 9 can be purged stably.

The ninth embodiment shows a case wherein pressure sensors are added to the exposure apparatus shown in the fourth embodiment. This concept can naturally be applied to any one of the exposure apparatuses shown in the first to third embodiments and in the fifth to eighth embodiments.

As described above, the exposure apparatus according to the ninth embodiment comprises the pressure sensor (S1) which measures the pressure inside the cover (9), and the pressure sensor (S2) which measures the pressure outside the cover (9). The flow rate of the purge gas to be supplied through the first supply port (6), and/or the flow rate of the purge gas to be recovered through the recovery port (7), and/or the flow rate of the purge gas to be supplied through the second supply port (12) is controlled, on the basis of the measurement results of the first and second pressure sensors (S1 and S2), such that the pressure inside the cover (9) is higher than the pressure outside the cover (9).

According to this arrangement, even if the pressure outside the cover fluctuates due to atmospheric pressure fluctuation outside the exposure apparatus, the pressure inside the cover can always be set higher than the pressure outside the cover, so that the pressure inside the cover can be purged stably. In place of the first and second pressure sensors, a differential pressure detection type pressure sensor may be obviously provided, which detects a difference between the pressures inside and outside the cover.

In the ninth embodiment, one pressure sensor is provided to each of the inside and outside of the cover 9. Alternatively, a plurality of pressure sensors may be provided to each of the inside and outside of the cover 9, and the pressures may be measured at a plurality of points. The flow rate of the purge gas to be supplied from the main control system 43 through the supply port 6, and/or the flow rate of the purge gas to be supplied through the recovery port 7, and/or the flow rate of the purge gas to be supplied through the sub-supply port 12 may be controlled on the basis of the measurement results. When the pressures are measured at the plurality of points, the inside of the cover 9 can be purged more stably.

Alternatively, the flow controller 42 may be operated such that the difference between the pressures inside and outside the cover 9, or the difference between the pressure inside the cover 9 and a pressure that represents the atmospheric pressure obtained by a pressure sensor (not shown), always becomes a preset constant value. Then, the external force acting on the projection lens from the lower surface of the projection lens can always be maintained at a constant value, deformation of members that constitute the projection lens can be prevented, and accordingly a high image formation performance of the projection lens can expectedly be obtained stably. In this case, if the pressure sensor S1 is a differential pressure measurement type sensor and the difference between a pressure at an arbitrary point outside the cover and the pressure inside the cover is measured directly, the arrangement can be made simpler.

As described above, according to the above embodiments, in an exposure apparatus using far ultraviolet rays, particularly, an ArF excimer laser beam, or a fluorine ($F_2$) excimer laser beam, the interior of exposure optical path in the vicinity of the wafer can be purged stably, even in an ambient flow caused by air or inert gas with a high impurity concentration, without being adversely affected by the ambient influence. Hence, the ArF excimer laser beam or fluorine ($F_2$) excimer laser beam can have sufficiently high transmittances, uniformities, and stabilities. Projection exposure can thus be performed at high accuracy, so that a fine circuit pattern can be projected well. Also, the total flow rate of the inert gas to be consumed can be decreased, and accordingly the running cost can be reduced.

<Other Embodiment>

[Application to a Semiconductor Manufacturing Apparatus]

Figure 24:
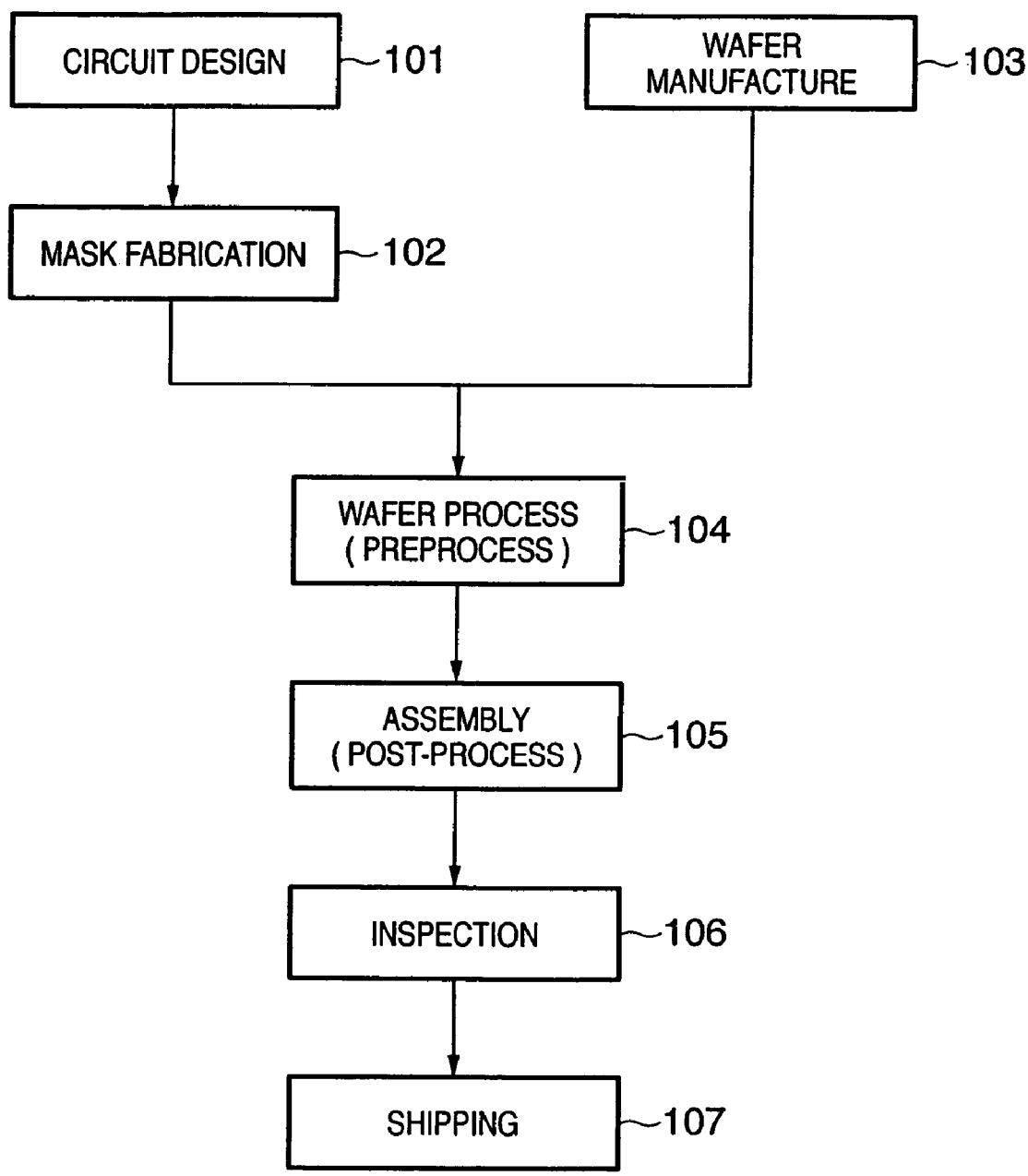
FIG. 24 is a flow chart showing a semiconductor device manufacturing flow.

An embodiment of a device manufacturing method using the above-described exposure apparatus will be explained. FIG. 24 shows a manufacturing flow for a microdevice (e.g., a semiconductor chip such as an IC or LSI, a liquid crystal panel, a CCD, a thin film magnetic head, a micromachine, or the like).

In step 101 (circuit design), the circuit of a semiconductor device is designed. In step 102 (mask fabrication), a mask having the designed circuit pattern is fabricated. In step 103 (wafer manufacture), a wafer is manufactured using a material such as silicon. In step 104 (wafer process), called a preprocess, an actual circuit is formed on the wafer by lithography using the prepared mask and wafer. In step 105 (assembly), called a post-process, a semiconductor chip is formed by using the wafer fabricated in step 104. This step includes processes such as assembly (dicing and bonding) and packaging (chip encapsulation). In step 106 (inspection), inspections including an operation check test and a durability test of the semiconductor device fabricated in step 105 are performed. A semiconductor device is completed with these steps, and is shipped (step 107).

Figure 25:
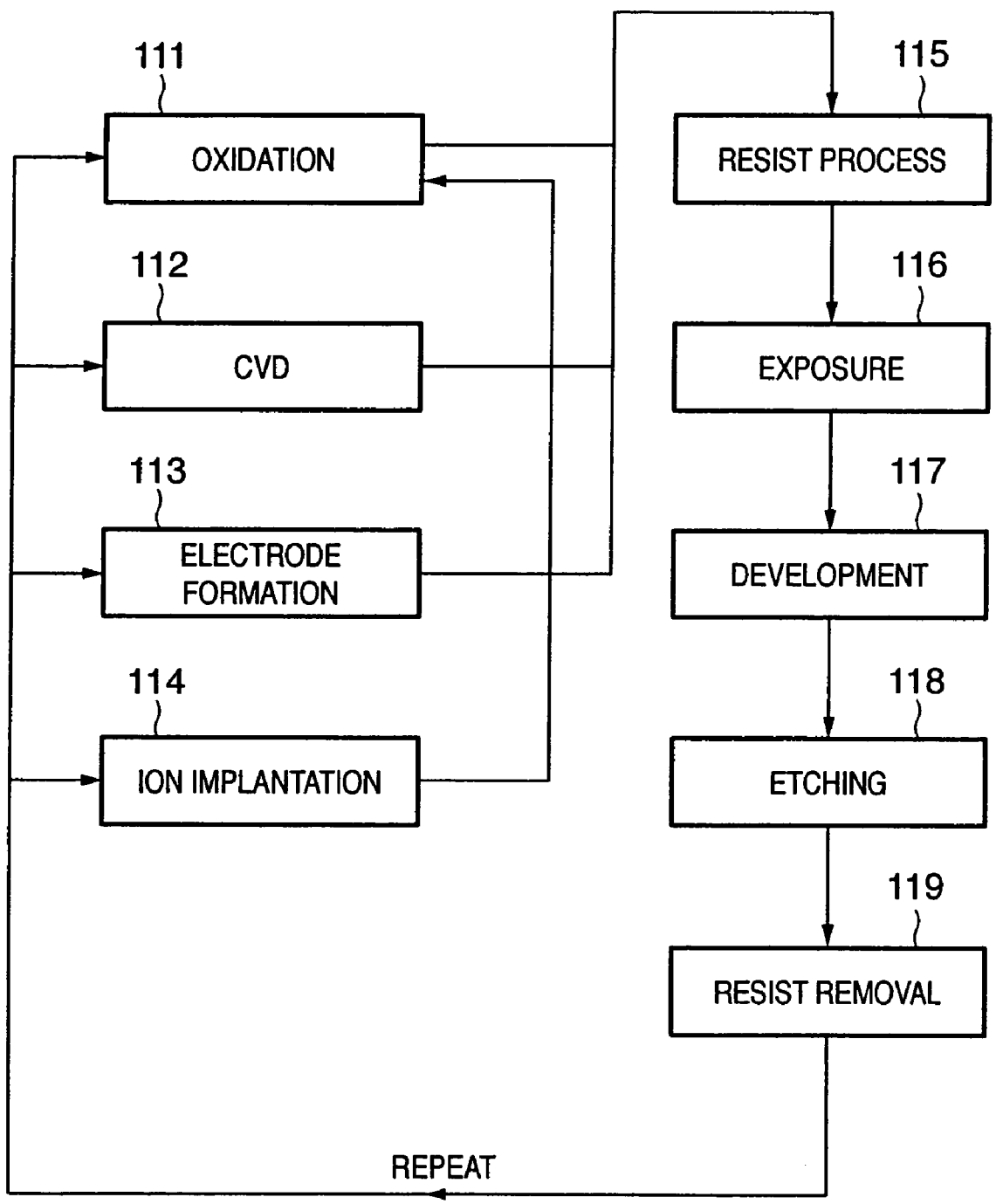
FIG. 25 is a flow chart showing in detail the flow of a wafer process.

FIG. 25 shows the flow of the above wafer process in detail. In step 111 (oxidation), the surface of the wafer is oxidized. In step 112 (CVD), an insulating film is formed on the wafer surface. In step 113 (electrode formation), an electrode is formed on the wafer by deposition. In step 114 (ion implantation), ions are implanted into the wafer. In step 115 (resist process), a photosensitive agent is applied to the wafer. In step 116 (exposure), the circuit pattern of the mask is printed and exposed onto the wafer by the exposure apparatus described above. In step 117 (development), the exposed wafer is developed. In step 118 (etching), portions other than the developed resist image are etched. In step 119 (resist removal), any unnecessary resist remaining after etching is removed. By repeating these steps, a multilayered structure of circuit patterns is formed on the wafer.

The manufacturing method described above can use any of the exposure apparatuses described in the above embodiments.

As has been described above, according to the present invention, inside a cover that extends from the wafer-side end of a projection optical system toward the vicinity of a wafer stage to surround an exposure optical path, stable purging can be realized.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to light via a mask, said apparatus comprising:
   a projection optical system configured to project a pattern of the mask onto the substrate;
   a cover configured to surround a path of light from said projection optical system toward the substrate;
   a first supply port arranged inside said cover and configured to supply inert gas inside said cover;

a first recovery port arranged inside said cover and configured to recover gas inside said cover;

a second supply port arranged outside said cover and configured to supply gas outside said cover; and a second recovery port arranged outside said cover and configured to recover gas outside said cover, wherein a first direction from said first supply port to said first recovery port and a second direction from said second supply port to said second recovery port oppose each other at an angle not greater than 90°.

2. An apparatus according to claim 1, further comprising:
a controller configured to control at least one of a first flow rate of inert gas supplied inside said cover and a second flow rate of gas recovered from inside said cover so that the first flow rate is greater than the second flow rate.

3. An apparatus according to claim 2, further comprising:
a first pressure sensor configured to measure pressure inside said cover; and
a second pressure sensor configured to measure pressure outside said cover,
wherein said controller is configured to control at least one of the first flow rate and the second flow rate based on measurements obtained by said first and second pressure sensors.

4. An apparatus according to claim 1, wherein the first direction and the second direction are opposite to each other at an angle not greater than 45°.

5. An apparatus according to claim 1, wherein the first direction and the second direction are just opposite to each other.

6. An apparatus according to claim 1, wherein said second supply port is configured to supply gas having an impurity concentration higher than that of inert gas supplied through said first supply port.

7. An apparatus according to claim 1, further comprising:
a third supply port arranged at a first portion of a bottom of said cover under said first supply port and configured to supply inert gas into a space between the first portion and the substrate.

8. An apparatus according to claim 7, further comprising:
a controller configured to control at least one of a first flow rate of inert gas supplied through said first and third supply ports and a second flow rate of gas recovered through said first recovery port so that the first flow rate is greater than the second flow rate.

9. An apparatus according to claim 7, wherein said apparatus is a scanning exposure apparatus, and a scanning direction of the substrate and the first direction are substantially parallel to each other.

10. An apparatus according to claim 9, further comprising:
a fourth supply port arranged at a second portion of a bottom of said cover under said first recovery port and configured to supply inert gas into a space between the second portion and the substrate.

11. An apparatus according to claim 1, further comprising:
a third recovery port arranged at a first portion of a bottom of said cover under said first supply port and configured to recover gas from a space between the first portion and the substrate.

12. An apparatus according to claim 11, further comprising:
a controller configured to control at least one of a first flow rate of inert gas supplied through said first supply port and a second flow rate of gas recovered through said first and third recovery ports so that the first flow rate is greater than the second flow rate.

13. An apparatus according to claim 11, wherein said apparatus is a scanning exposure apparatus, and a scanning direction of the substrate and the first direction are substantially parallel to each other.

14. An apparatus according to claim 13, further comprising:
a fourth recovery port arranged at a second portion of a bottom of said cover under said first recovery port and configured to recover gas from a space between the second portion and the substrate.

15. An apparatus according to claim 1, further comprising:
a straightening member arranged at a bottom of said cover under said first supply port.

16. A method of manufacturing a device, said method comprising steps of:
exposing a substrate to light using an exposure apparatus as defined in claim 1;
developing the exposed substrate; and
processing the developed substrate to manufacture the device.

* * * * *

UNITED STATES PATENT AND TRADEMARK OFFICE
CERTIFICATE OF CORRECTION

PATENT NO. : 7,057,701 B2
APPLICATION NO. : 10/786063
DATED : June 6, 2006
INVENTOR(S) : Takahito Chibana et al.

It is certified that error appears in the above-identified patent and that said Letters Patent is hereby corrected as shown below:

ON THE TITLE PAGE:
    Item "(56) References Cited," under "U.S. PATENT DOCUMENTS," the first-listed U.S. patent in the second column, "6,707,530 B1* 3/2004 Schrijver et al. ............355/30" should read -- 6,707,530 B2* 3/2004 Schrijver et al. ...............355/30 --.

COLUMN 8:
    Line 2, "recover" should read -- recovery --.
    Line 58, "be purged stably." should read -- be stably purged. --.

COLUMN 12:
    Line 20, "be purged stably." should read -- be stably purged. --.
    Line 35, "gas." should read -- gas. Then, the total flow rate of the high-purity inert gas (purge gas) to be used in the exposure apparatus can be reduced, so that the operation cost of the apparatus can be reduced. --.

COLUMN 16:
    Line 25, "purged stably." should read -- stably purged. --
    Line 46, "port" should read -- part --.

COLUMN 17:
    Line 12, "be purged" should read -- be stably purged.--.
    Line 13, "stably." should be deleted.
    Line 25, "be purged stably." should read -- be stably purged. --.
    Line 49, "be purged stably." should read -- be stably purged. --.

COLUMN 19:
    Line 18, "be purged stably." should read -- be stably purged. --.

COLUMN 20:
    Line 62, "purged stably." should read -- stably purged. --.

COLUMN 21:
    Line 40, "purged stably." should read -- stably purged. --
    Line 58, "purged stably." should read -- stably purged. --.

COLUMN 22:
    Line 15, "purged more stably." should read -- more stably purged. --.
    Line 23, "purged stably" should read -- stably purged --.
    Line 61, "purged stably." should read -- stably purged. --.

UNITED STATES PATENT AND TRADEMARK OFFICE
CERTIFICATE OF CORRECTION

PATENT NO. : 7,057,701 B2
APPLICATION NO. : 10/786063
DATED : June 6, 2006
INVENTOR(S) : Takahito Chibana et al.

It is certified that error appears in the above-identified patent and that said Letters Patent is hereby corrected as shown below:

COLUMN 23:
    Line 3, "purged stably." should read -- stably purged. --.
    Line 25, "purged" should read -- stably purged --.
    Line 26, "stably." should be deleted.
    Line 42, "purged more stably." should read -- more stably purged. --.
    Line 63, "purged stably," should read -- stably purged, --.

Signed and Sealed this

Second Day of January, 2007

JON W. DUDAS
*Director of the United States Patent and Trademark Office*